(12) United States Patent
Rivollier et al.

(10) Patent No.: US 9,184,079 B2
(45) Date of Patent: Nov. 10, 2015

(54) SYSTEMS AND METHODS FOR HANDLING WAFERS

(75) Inventors: Frederic Rivollier, Cambridge (CA); Ryan Chubb, Waterloo (CA)

(73) Assignee: ATS AUTOMATION TOOLING SYSTEMS INC., Cambridge, Ontario (CA)

( * ) Notice: Subject to any disclaimer, the term of this patent is extended or adjusted under 35 U.S.C. 154(b) by 720 days.

(21) Appl. No.: 12/750,095

(22) Filed: Mar. 30, 2010

(65) Prior Publication Data

US 2010/0272544 A1    Oct. 28, 2010

Related U.S. Application Data

(60) Provisional application No. 61/164,639, filed on Mar. 30, 2009.

(51) Int. Cl.
*H01L 21/677* (2006.01)
*H01L 21/673* (2006.01)

(52) U.S. Cl.
CPC .... *H01L 21/67781* (2013.01); *H01L 21/67383* (2013.01); *H01L 21/67766* (2013.01); *Y10S 414/137* (2013.01)

(58) Field of Classification Search
CPC ................................................ H01L 21/67383
USPC ............. 414/416.02, 416.03, 416.04, 416.08, 414/937, 938
See application file for complete search history.

(56) References Cited

U.S. PATENT DOCUMENTS

| | | | |
|---|---|---|---|
| 4,609,103 A * | 9/1986 | Bimer et al. | 206/711 |
| 4,840,530 A * | 6/1989 | Nguyen | 414/404 |
| 4,856,957 A * | 8/1989 | Lau et al. | 414/404 |
| 4,911,597 A | 3/1990 | Maydan et al. | |
| 5,154,730 A | 10/1992 | Hodos et al. | |

(Continued)

FOREIGN PATENT DOCUMENTS

| | | | | |
|---|---|---|---|---|
| EP | 1925577 | | 5/2008 | |
| JP | 1-230244 A * | | 9/1989 | 414/938 |

(Continued)

OTHER PUBLICATIONS

International Searching Authority (CA), International Search Report, Jul. 7, 2010, PCT/CA2010/000487.

(Continued)

*Primary Examiner* — James Keenan
(74) *Attorney, Agent, or Firm* — Gowling Lafleur Henderson LLP; Neil Henderson

(57) ABSTRACT

A system for handling wafers comprising: at least one unload station; at least one intermediate station designed to hold the wafers at an angle; a processing station; and a transfer device configured to move the wafers between the stations. The intermediate station may be configured to receive the wafers in a back-to-back arrangement. An apparatus for handling wafers comprising: on one side, a vacuum gripper configured to grip individual wafers; and, on the other side, a gravity gripper configured to support one or more wafers when positioned beneath the wafers and lifted. A method for handling wafers, comprising: unloading wafers; transferring the wafers to an intermediate station; transferring the wafers from the intermediate station to a processing station; treating the wafers; unloading the wafers from the processing station; and reloading the wafers in a carrier, wherein the wafers are unloaded, transferred and reloaded by a transfer device.

15 Claims, 32 Drawing Sheets

(56) References Cited

U.S. PATENT DOCUMENTS

| | | | | |
|---|---|---|---|---|
| 5,183,370 | A | * | 2/1993 | Cruz ..................... 414/416.03 |
| 5,636,960 | A | * | 6/1997 | Hiroki et al. .................. 414/781 |
| 5,697,748 | A | * | 12/1997 | Somekh et al. ............... 414/217 |
| 5,730,574 | A | * | 3/1998 | Adachi et al. ............ 414/225.01 |
| 5,738,574 | A | | 4/1998 | Tolles et al. |
| 5,740,059 | A | * | 4/1998 | Hirata et al. .................. 700/213 |
| 5,887,721 | A | * | 3/1999 | Betsuyaku .................... 206/711 |
| 5,988,971 | A | * | 11/1999 | Fossey et al. ............. 414/416.01 |
| 6,053,694 | A | * | 4/2000 | Dill ................................ 414/778 |
| 6,092,971 | A | * | 7/2000 | Balg et al. ................ 414/416.03 |
| 6,183,186 | B1 | * | 2/2001 | Howells et al. .......... 414/416.03 |
| 6,286,688 | B1 | * | 9/2001 | Mimken et al. ............ 211/41.18 |
| 6,345,947 | B1 | * | 2/2002 | Egashira .................. 414/225.01 |
| 6,368,040 | B1 | * | 4/2002 | Yamasaki et al. ........ 414/225.01 |
| 6,393,337 | B1 | * | 5/2002 | Perlov et al. .................. 700/229 |
| 6,833,035 | B1 | * | 12/2004 | Thompson et al. ............. 134/33 |
| 7,083,376 | B2 | * | 8/2006 | Crofton et al. ................ 414/811 |
| 7,134,827 | B2 | * | 11/2006 | Larson et al. ............ 414/416.01 |
| 7,367,773 | B2 | * | 5/2008 | Buitron et al. ................ 414/806 |
| 7,600,359 | B2 | * | 10/2009 | Buitron ........................... 53/446 |
| 8,002,511 | B2 | * | 8/2011 | Kamikawa et al. ...... 414/416.02 |
| 8,079,797 | B2 | * | 12/2011 | Tanaka et al. ............ 414/222.13 |
| 8,133,002 | B2 | * | 3/2012 | Jonas et al. ................... 414/810 |
| 2001/0025528 | A1 | | 10/2001 | Blew |
| 2002/0078892 | A1 | | 6/2002 | Takahashi |
| 2009/0281653 | A1 | * | 11/2009 | Jonas et al. ................... 700/223 |

FOREIGN PATENT DOCUMENTS

| | | | | |
|---|---|---|---|---|
| JP | | H01230244 | | 9/1989 |
| JP | | 5-226458 A | * | 9/1993 ................... 414/938 |
| JP | | 2002151566 | | 5/2002 |
| JP | | 2003092330 | | 3/2003 |
| JP | | 2005123642 | | 5/2005 |
| JP | | 2008124091 | | 5/2008 |
| TW | | 200834790 | | 8/2008 |
| WO | | 2006070630 | | 7/2006 |

OTHER PUBLICATIONS

International Searching Authority (CA), The Written Opinion of the International Searching Authority, Jul. 7, 2010, PCT/CA2010/000487.
European Patent Office, Supplementary European Search Report dated Jan. 11, 2011, EP Application No. 10 75 7971.
English Abstract of PCT/JP2005/023257, Publication No. WO 2006/070630, Feb. 23, 2012, European Patent Office, espace.net.
English Abstract of European Application No. 06077093.0, Patent No. EP 1925577, Feb. 23, 2012, European Patent Office, espace.net.
State Intellectual Property Office of P. R. China, English translation of First Office Action for Chinese Patent Appln. No. 201080014631.9, issued Aug. 5, 2013.
Japanese Patent Office, Notification of Reasons for Rejection for Japanese Patent Appln. No. 2012502404, Feb. 5, 2014.
Japanese Patent Office, Patent Abstracts of Japan for Japanese Patent Publication No. 2003092330.
Japanese Patent Office, Patent Abstracts of Japan for Japanese Patent Publication No. 2005123642.
Japanese Patent Office, Patent Abstracts of Japan for Japanese Patent Publication No. 2008124091.
Japanese Patent Office, Patent Abstracts of Japan for Japanese Patent Publication No. 2002151566.
Taiwan Patent Office, Notice of Substantive Examination Opinion of Intellectual Property Office of Ministry of Economic Affairs for Taiwanese Patent Appln. No. 099109588, dated Jan. 28, 2015.

* cited by examiner

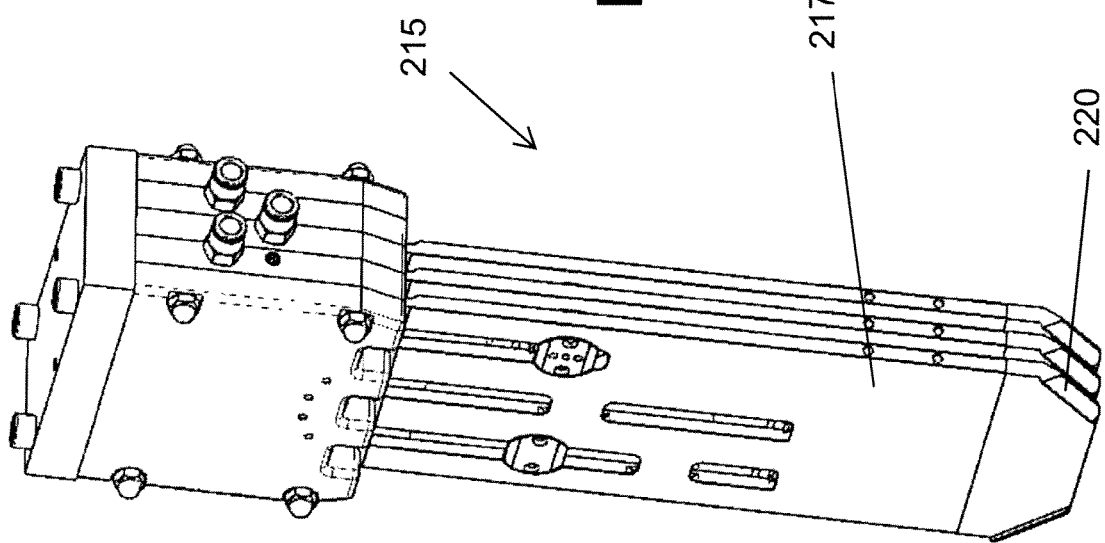

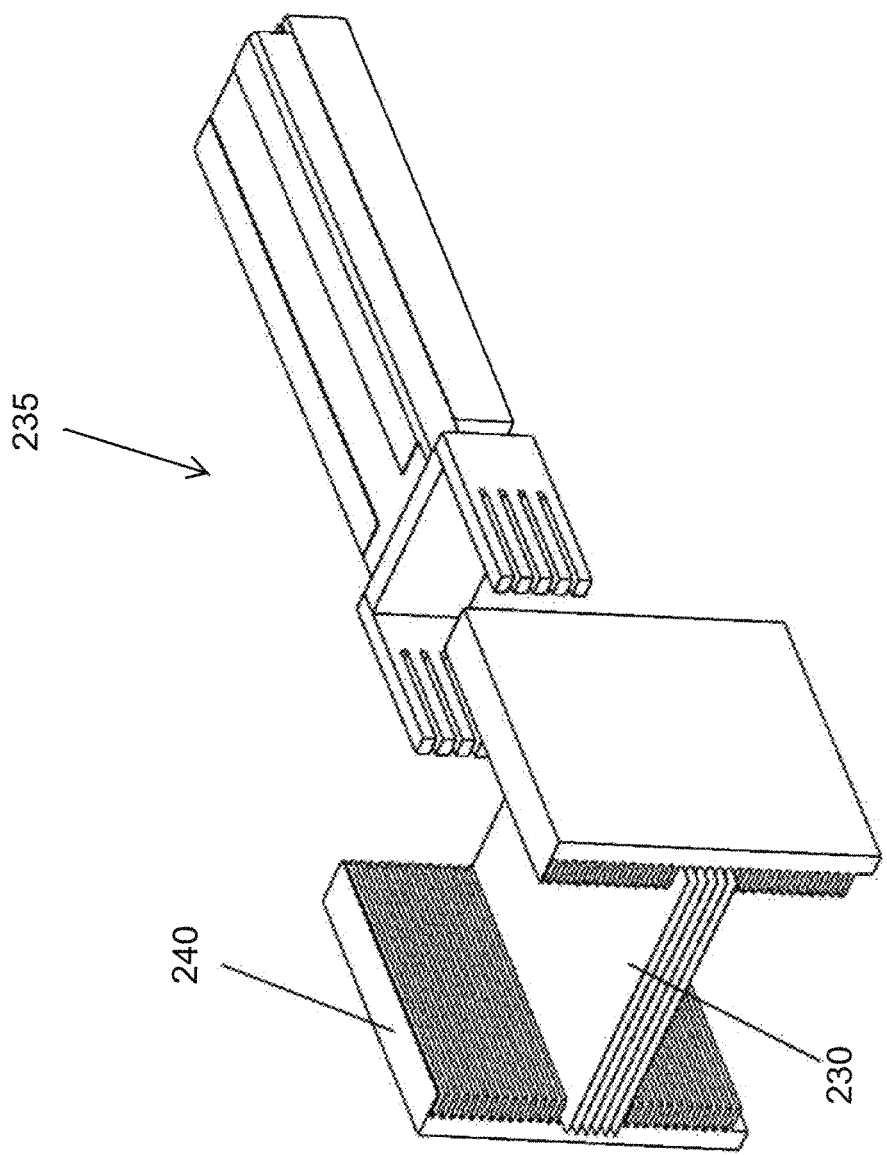

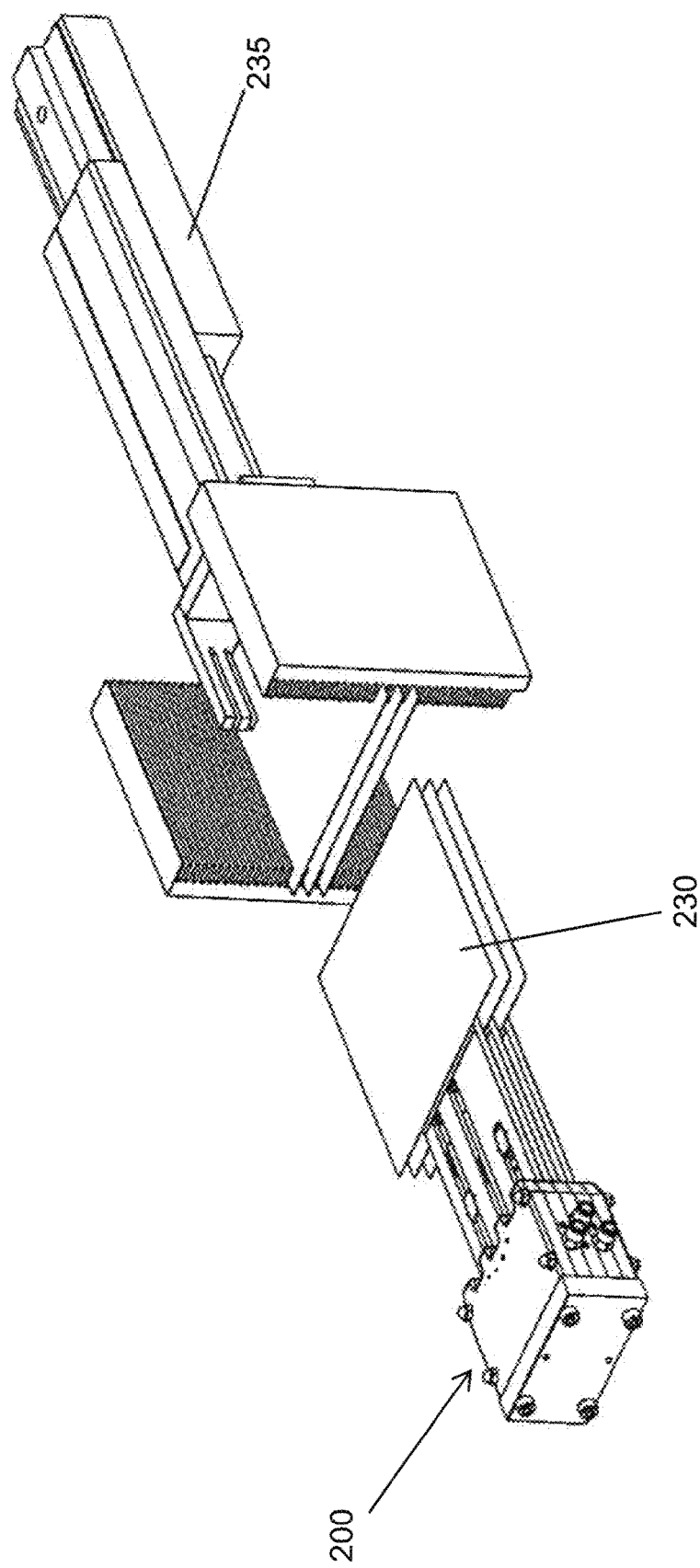

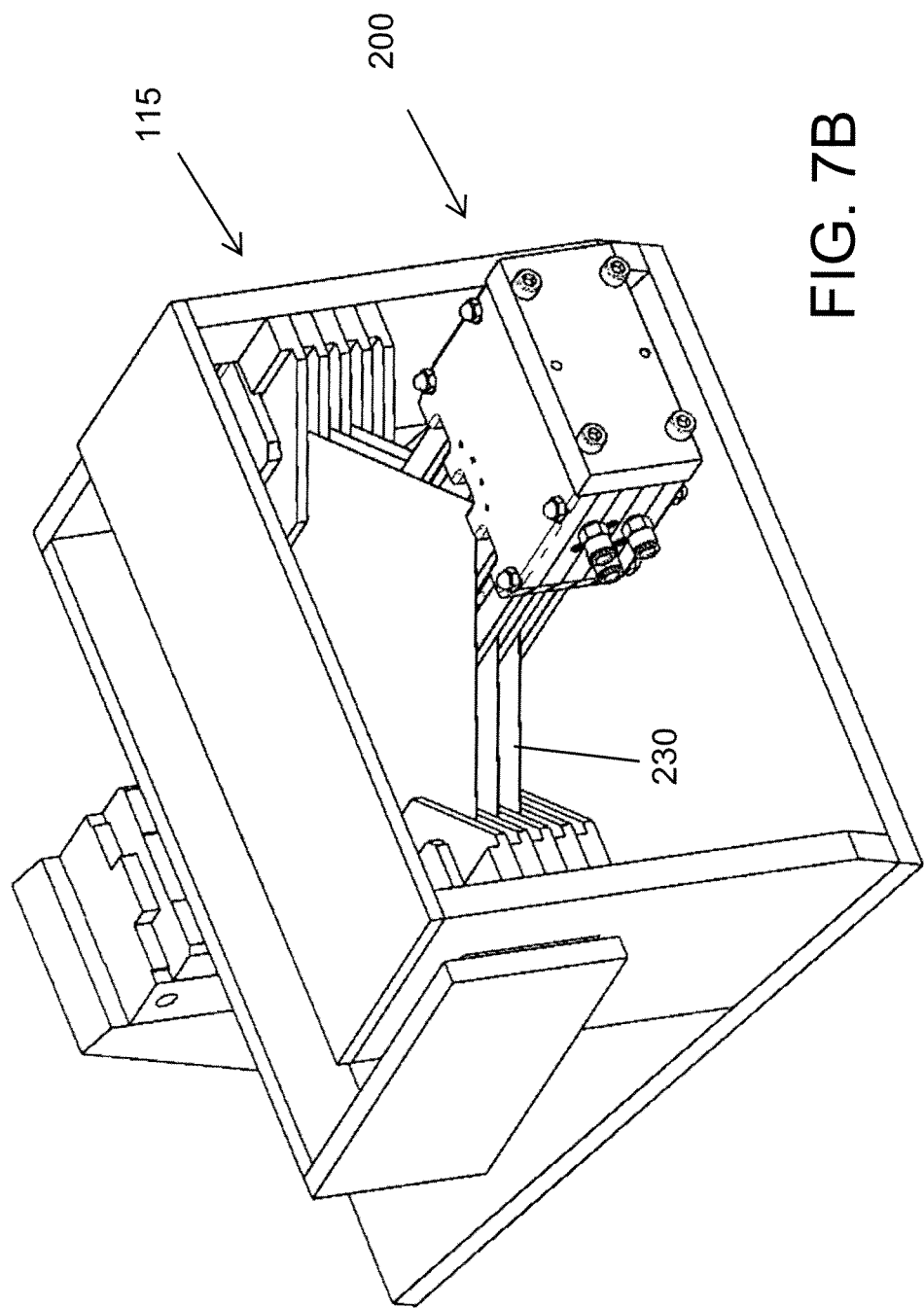

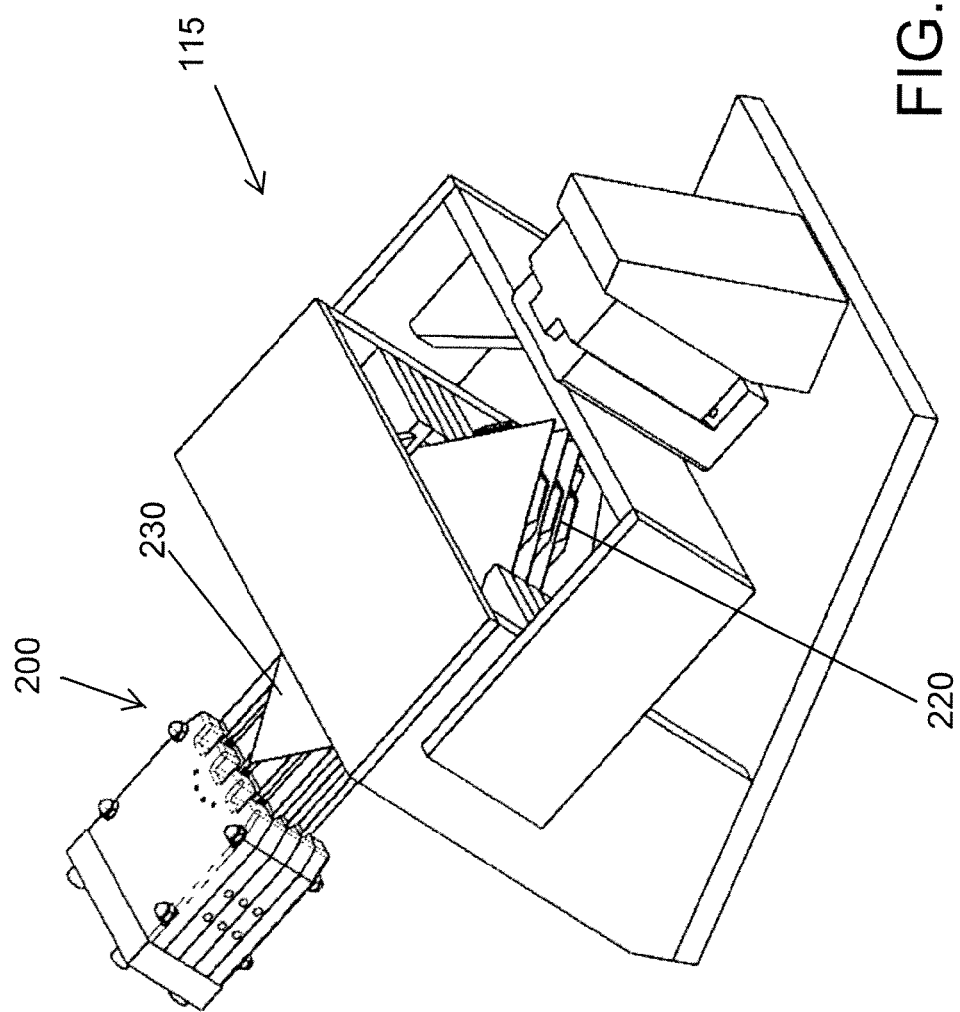

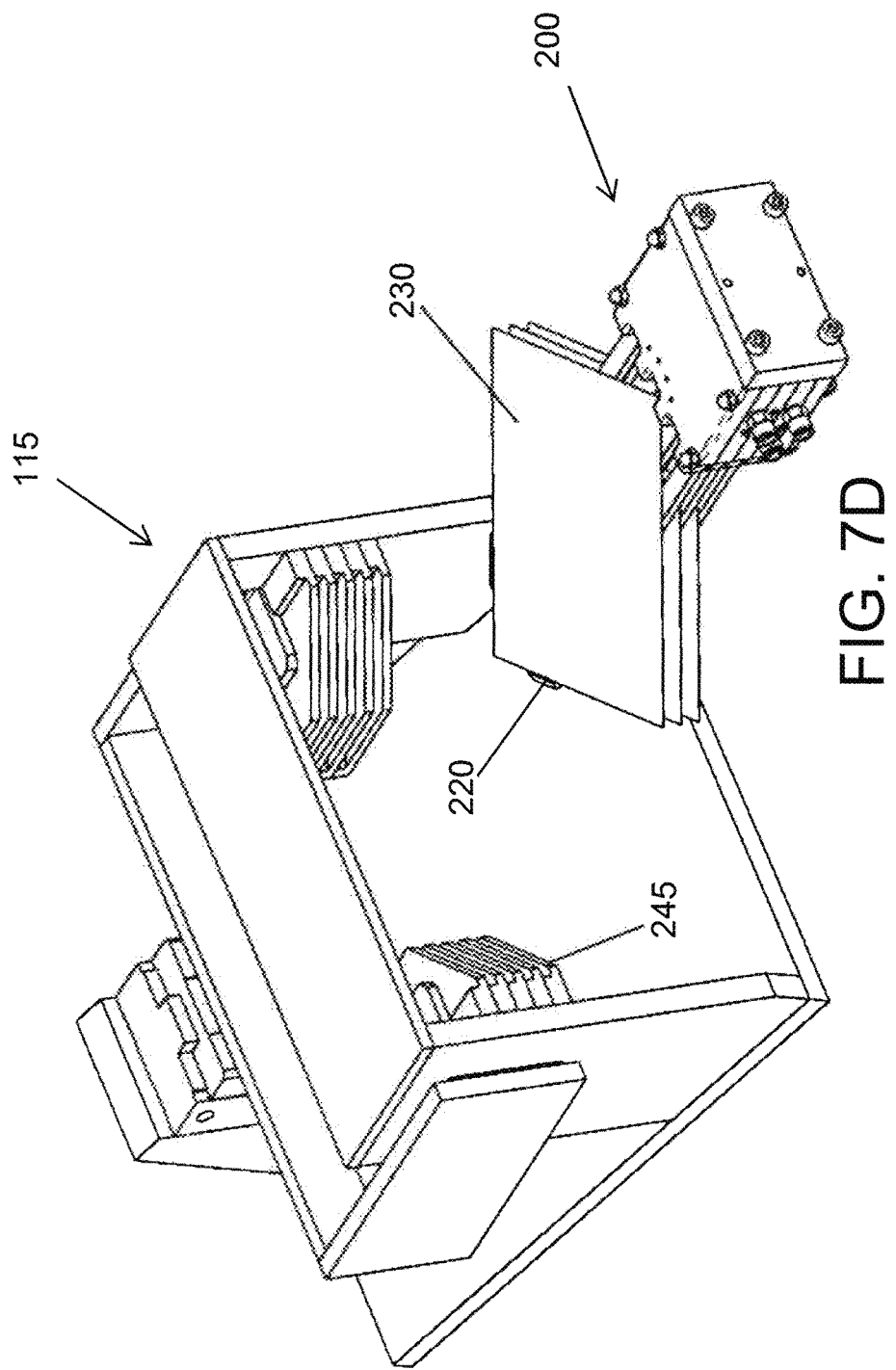

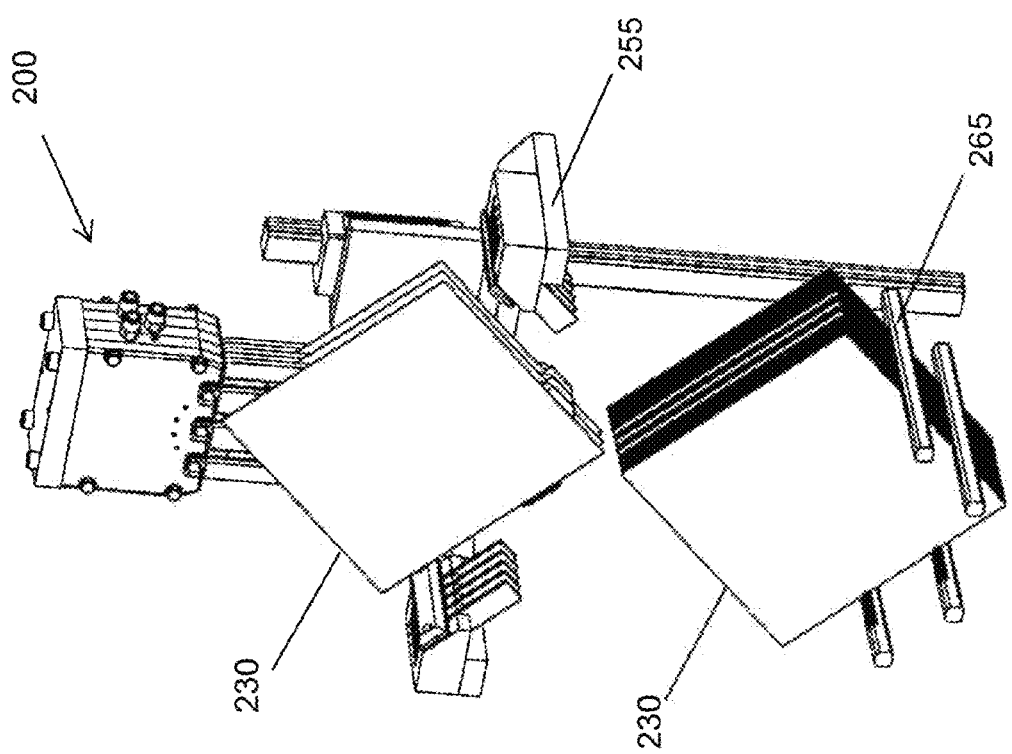

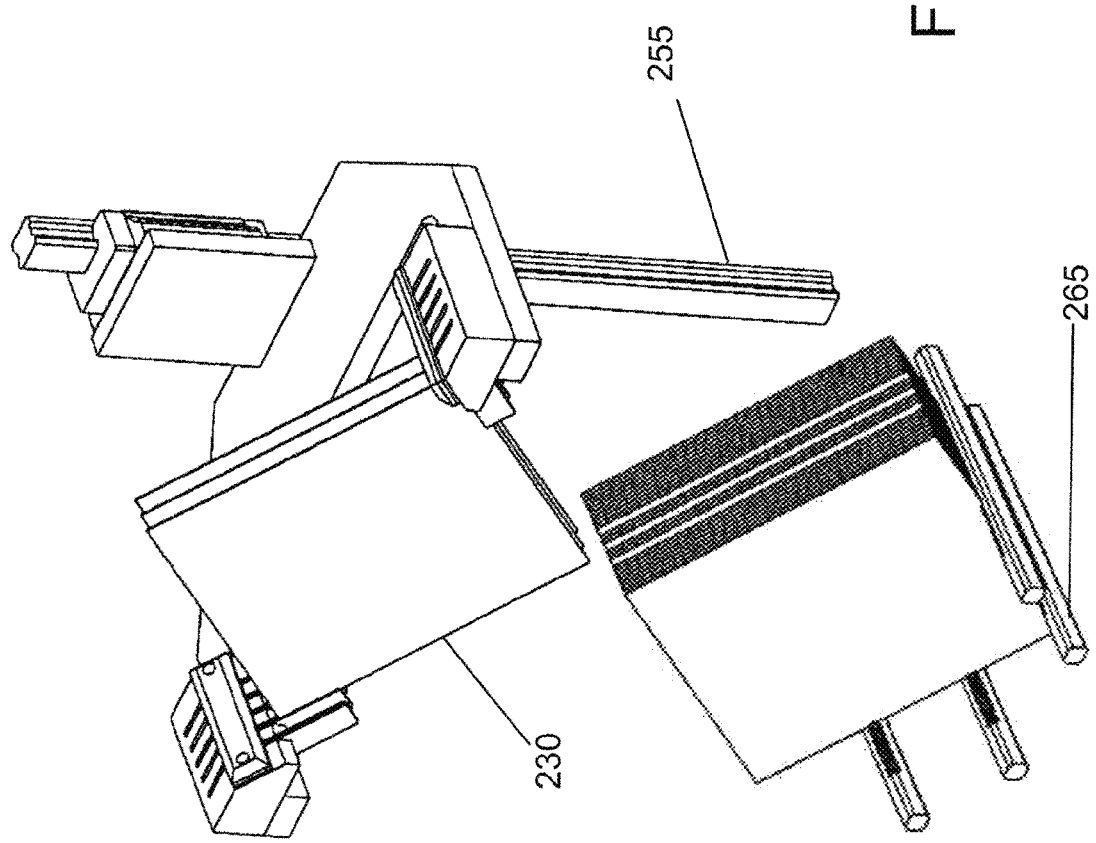

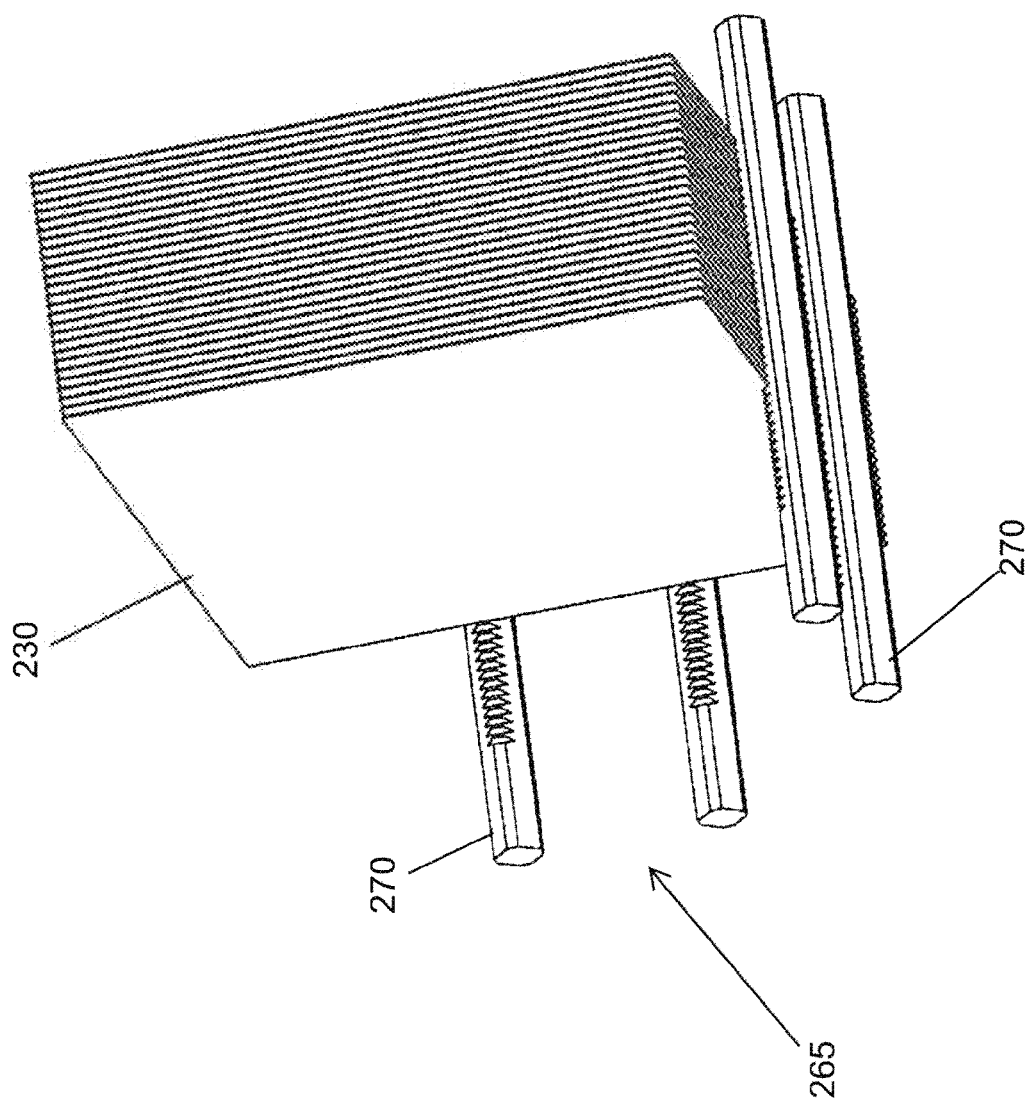

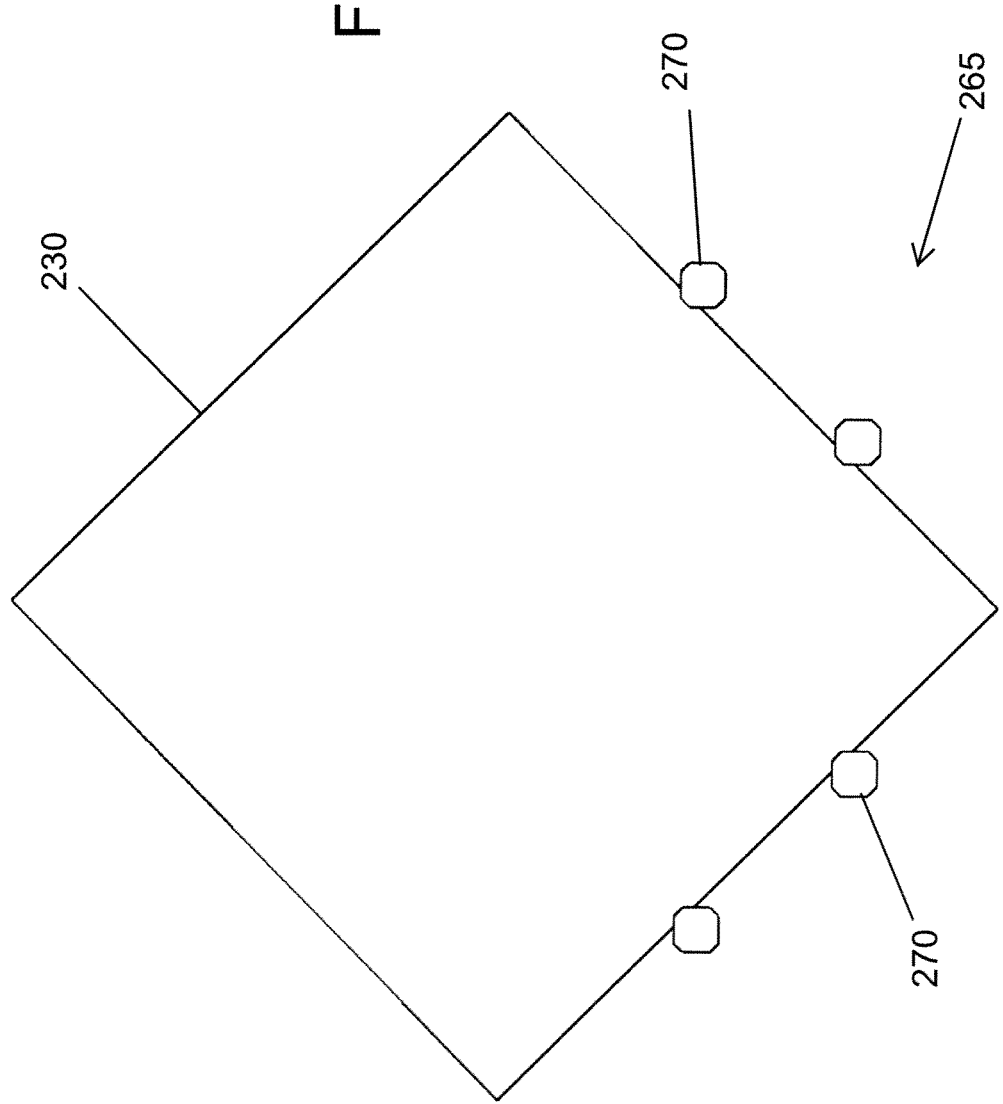

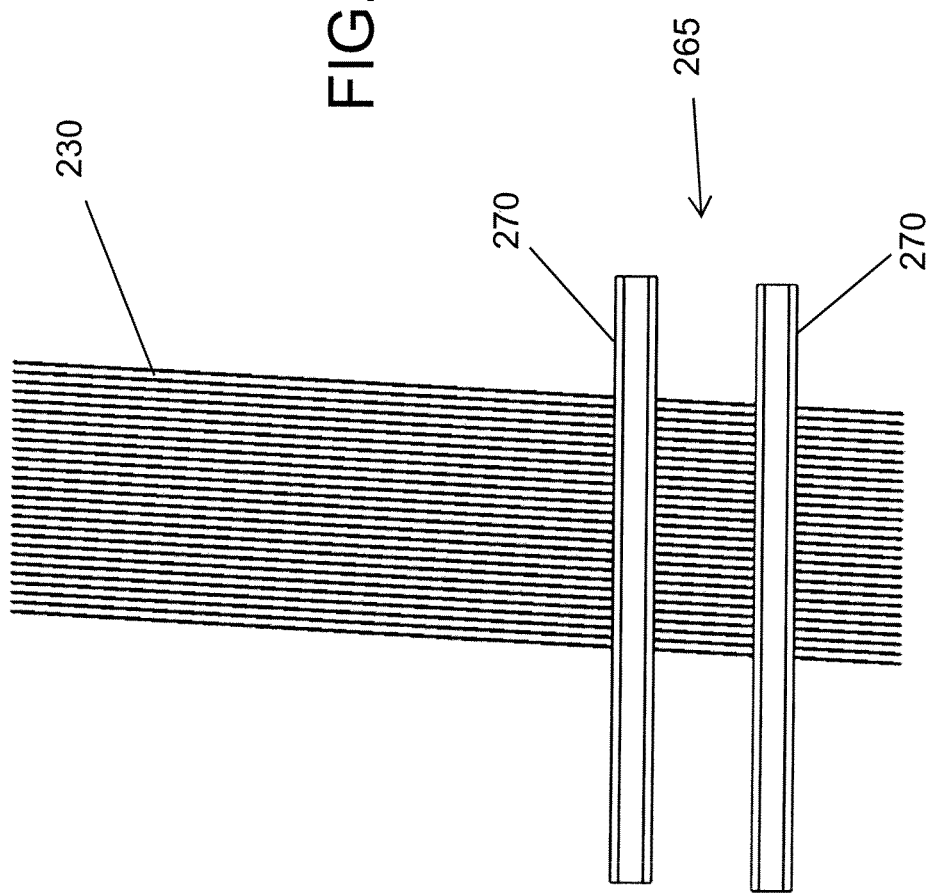

SYSTEMS AND METHODS FOR HANDLING WAFERS

CROSS-REFERENCE TO RELATED APPLICATION

This application claims priority to U.S. Provisional Application No. 61/164,639, filed Mar. 30, 2009.

FIELD

This application generally relates to the handling of thin wafers in a manufacturing environment, and more particularly, relates to the handling of solar cell wafers for loading and unloading in a diffusion furnace process.

BACKGROUND

In manufacturing, the handling of thin, fragile materials (herein referred to as "wafers") can be very difficult due to the wastage, both of materials and of time, that can occur if the wafers are broken during the manufacturing process. Wafers may be of various materials, however, one particular example of a wafer is a silicon wafer such as that used in electronics, solar, and other applications.

Solar cell wafers are fragile, thin planar wafers that are typically made out of semiconductor materials such as silicon, GaAs, or the like. In order to increase efficiency and reduce material costs, solar cell wafers are being made thinner and thinner, causing many difficulties in the manufacturing process due to breakage and wastage of the solar cell wafers during handling.

One particular process in the manufacturing of solar cell wafers involves the wafers being loaded into and unloaded from a diffusion furnace for treatment. In this process, it is preferred that only one side of the solar cell wafer to be treated in the diffusion furnace. As such, the solar cell wafers are typically placed back to back ("BTB") such that only one side of each wafer is presented to the environment of the diffusion furnace.

Conventional systems for handling wafers as they are moved into and out of the diffusion furnace tend to be quite complex and bulky and do not use floor space efficiently, including complex systems to accurately position the wafers in a back to back format. For example, some conventional systems use a complex comb structure in a carrier to attempt to accurately position the BTB wafers. The handling of wafers in this way can reduce throughput due to the amount of time required in handling and can still result in relatively large amounts of breakage and wastage of materials due to misalignment of wafers and the like.

As such, there is need for an improved system, apparatus and method of handling wafers and, in particular, for handling solar cell wafers.

SUMMARY

The system, apparatus and/or method is intended to overcome at least one of the above disadvantages.

In one aspect described herein, there is provided a system for handling wafers comprising: at least one unload station; at least one intermediate station designed to hold the wafers at an angle; a processing station; and a transfer device configured to move the wafers between the stations.

In one case, the transfer device may be provided with a vacuum gripper and a gravity gripper.

In another case, the intermediate station may be configured to receive the wafers in a back-to-back (BTB) arrangement in which one group of wafers are placed in the intermediate station and a second group of wafers are placed in the intermediate station on top of the first group of wafers such that the wafers are back-to-back.

According to another aspect, there is provided an apparatus for handling wafers comprising: on one side, a vacuum gripper configured to grip individual wafers; and, on the other side, a gravity gripper configured to support one or more wafers when positioned beneath the wafers and lifted.

In a further aspect a method for handling wafers is provided, comprising: unloading wafers; transferring the wafers to an intermediate station; transferring the wafers from the intermediate station to a processing station; treating the wafers; unloading the wafers from the processing station; and reloading the wafers in a carrier, wherein the wafers are unloaded, transferred and reloaded by a transfer device.

In one case the wafers may be separated into single wafer after being treated.

In one aspect, a system for handling a plurality of wafers is provided, the wafers having a generally planar upper surface and a generally planar lower surface, the system comprising: at least one unload station; at least one intermediate station having a front end and a back end, the at least one intermediate station configured to hold the wafers with a plane of the wafers positioned at an angle to a horizontal plane; and a transfer device configured to transport the wafers between the unload station and the intermediate station.

In one case, the transfer device is provided with a vacuum gripper and a gravity gripper.

In another case, the at least one intermediate station comprises a plurality of slots, each slot provided with a rear stop configured to support a wafer.

In another case, the angle is downwardly from the front end to the back end.

In another case, the angle is between 30 and 60 degrees.

In another case, the angle is 45 degrees.

In another case, the at least one intermediate station has at least one slot configured to receive a first one of the plurality of wafers and a second one of the plurality of wafers in a back-to-back arrangement whereby the first wafer is inserted into the at least one slot, and the second wafer is inserted into the at least one slot on top of the first wafer with the respective upper surfaces of the first and second wafers in contact.

In another case, the at least one intermediate station includes a vacuum element designed to lift the second wafer in the back-to-back arrangement.

In another case, the transfer device is configured to remove wafers in the back-to-back arrangement from the at least one intermediate station and place the wafers into an edge holding device for loading into a processing carrier.

In another case, the at least one intermediate station has at least one slot configured to receive a first one of the plurality of wafers and a second one of the plurality of wafers in a back-to-back arrangement whereby the first wafer is inserted into the at least one slot, and the second wafer is inserted into the at least one slot on top of the first wafer with the respective lower surfaces of the first and second wafers in contact.

In another case, the at least one intermediate station includes a vacuum element designed to lift the second wafer in the back-to-back arrangement.

In another case, the transfer device is configured to remove wafers in the back-to-back arrangement from the at least one intermediate station and place the wafers into an edge holding device for loading into a processing carrier.

In another case, the system further comprises a processing station, the processing station is configured to accept a processing carrier loaded with the plurality of wafers, wherein the carrier is moved to a furnace for processing.

In another aspect, an apparatus for handling wafers is provided comprising at least one finger, the at least one finger comprising: a first side having a vacuum gripper configured to hold a first selected wafer by vacuum suction force; a second side having a gravity gripper configured to support a second selected wafer when the gravity gripper is positioned beneath the selected wafer and lifted; and the at least one finger being rotatable such that the first side or the second side is selectively positionable against the first selected wafer or the second selected wafer.

In one case, the vacuum gripper includes a vacuum supply system and a plurality of pores in communication with the vacuum supply system.

In another case, the vacuum supply system is configured to receive a vacuum hose.

In another case, the gravity gripper includes a flat surface and at least one raised portion such that a wafer rests against the flat portion and is supported by the at least one raised portion.

In another case, the gravity gripper has two raised portions, the two raised portions positioned on opposite sides of the gravity gripper and oriented at an angle to the distal end such that the wafer is positioned with a corner of the wafer fitting between the two raised portions.

In another case, the gravity gripper includes a flat surface and at least two raised portions such that a wafer rests against the flat portion and is supported by the at least two raised portions.

In yet another aspect, a method for handling wafers is provided comprising: unloading wafers from an unload station; transferring the wafers from the unload station to an intermediate station; transferring the wafers from the intermediate station to a processing station; treating the wafers; unloading the wafers from the processing station; and reloading the wafers in a carrier, wherein the wafers are unloaded, transferred and reloaded by a transfer device.

In one case, the method further comprises positioning the wafers in the intermediate station in a back-to-back arrangement such that pairs of wafers are positioned with their respective upper surfaces in contact.

In another case, the method further comprises positioning the wafers in the intermediate station in a back-to-back arrangement such that pairs of wafers are positioned with their respective lower surfaces in contact.

In another case, the method further comprises positioning the wafers in the carrier in individual respective slots, the wafers being aligned with their upper surfaces oriented upward.

Other aspects and features will become apparent to those ordinarily skilled in the art upon review of the following description of specific embodiments in conjunction with the accompanying figures.

BRIEF DESCRIPTION OF THE DRAWINGS

For a better understanding of the embodiments described herein and to show more clearly how they may be carried into effect, reference will now be made, by way of example only, to the accompanying drawings which show the exemplary embodiments and in which:

FIGS. 3A and 3B are perspective views of an end effector of a robot for handling wafers;

FIGS. 4A, 4B and 4C are views of a pusher for moving wafers to the end effector;

FIGS. 7A, 7B, 7C and 7D are views of the end effector removing BTB wafers from the intermediate load station;

FIGS. 8A and 8B are views of the end effector placing wafers in an edge holding device;

FIGS. 9A, 9B, 9C, 9D and 9E are views of the edge holding device placing BTB wafers in a furnace boat;

FIGS. 10A, 10B, 10C, and 10D are views of the BTB wafers in the furnace boat;

Figure 1:
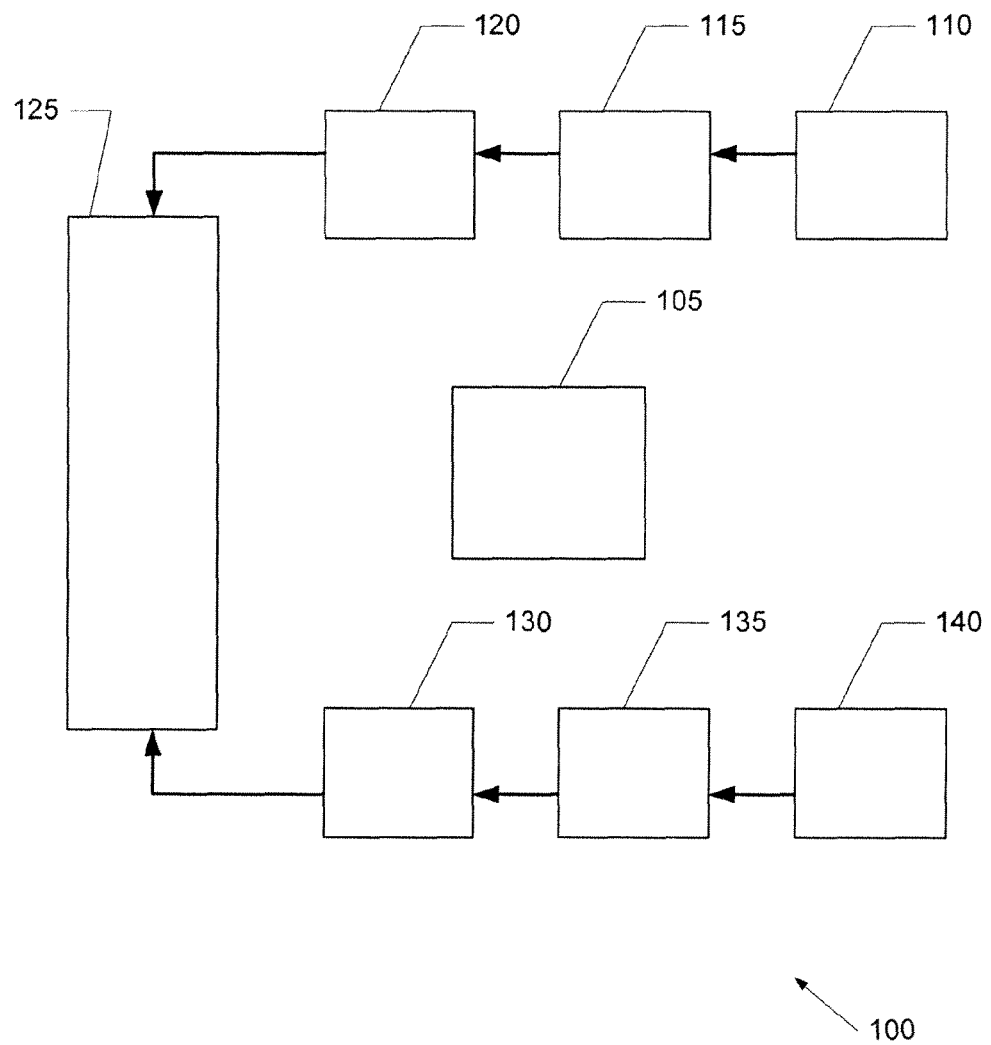
FIG. 1 is a block diagram of an exemplary system for handling wafers.

It will be appreciated that for simplicity and clarity of illustration, where considered appropriate, reference numerals may be repeated among the figures to indicate corresponding or analogous elements or steps. In addition, numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments described herein.

DETAILED DESCRIPTION

FIG. 1 shows a block diagram of an example system for wafer handling 100 according to an embodiment herein. In this particular embodiment, the wafers are solar cell wafers having a thickness of approximately 160 micrometers. The system of FIG. 1 is an overview of a handling process for moving wafers from a carrier to a diffusion furnace boat and back to the carrier. However, it will be understood that the systems and methods used in this embodiment may be applied to other wafer handling situations.

For movement within the manufacturing environment, the wafers are typically loaded into a carrier (not shown in FIG. 1). The carrier includes a plurality of slots into which the wafers are inserted in order to protect the wafers from breakage during movement.

In the system of FIG. 1, a transfer device, which may be a robot 105, is provided to transfer wafers among various stations in the system. Initially, the carrier arrives at a wafer unload station 110, typically via a conveyor system (not shown) such as an overhead conveyor or the like. At the wafer unload station 110, the wafers are removed from the carrier in preparation for transfer to a furnace carrier (sometimes referred to as a furnace boat). As noted above, in order to increase throughput efficiency and to allow for treatment of only one side of the solar wafers, the solar wafers are typically placed back-to-back (BTB) before being processed in a diffusion furnace. The accurate positioning of the wafers in this BTB arrangement in the furnace boat at a manufacturing rate presents some difficulties.

In the present embodiment, the robot 105 first transfers the wafers from the carrier to an intermediate load station 115 to be placed in the BTB arrangement. As will be described further below, the intermediate load station 115 allows for accurate and sensitive BTB placement of the wafers.

From the intermediate load station 115, the robot 105 moves the BTB wafers to a boat loading station 120 for placement in the furnace boat. Once the BTB wafers are loaded in the furnace boat, the furnace boat is moved into a processing station, which may be a diffusion furnace 125, for treatment. The movement into the diffusion furnace 125 can be via a conveyor (not shown), servo axis, other robot, or the like.

Following processing and treatment in the diffusion furnace 125, the furnace boat moves to a boat unloading station 130. The robot 105 transfers the BTB wafers from the boat to an intermediate unload station 135 where the BTB wafers are separated into single wafers for transfer by the robot to a reload station 140 where the wafers are replaced in the carrier.

It will be understood that additional robots or stations may be added as needed for throughput purposes. For example, one robot may be provided to unload wafers prior to diffusion while another robot may be provided to load wafers following diffusion. Similarly, in a lower throughput situation, the intermediate load station may also be used as the intermediate unload station. Still further, the furnace boat load and unload stations could be the same station, and, in some cases, the load and unload could take place on the same boat at the same time. This modular use of the various stations provides manufacturing flexibility to allow the manufacturing line to be quickly modified to provide higher or lower throughput depending on need.

The following paragraphs outline further details of the robot and each station and the processes that occur at each station. It will be understood that the specific embodiments herein are for reference only and that other embodiments may be available.

Figure 2A:
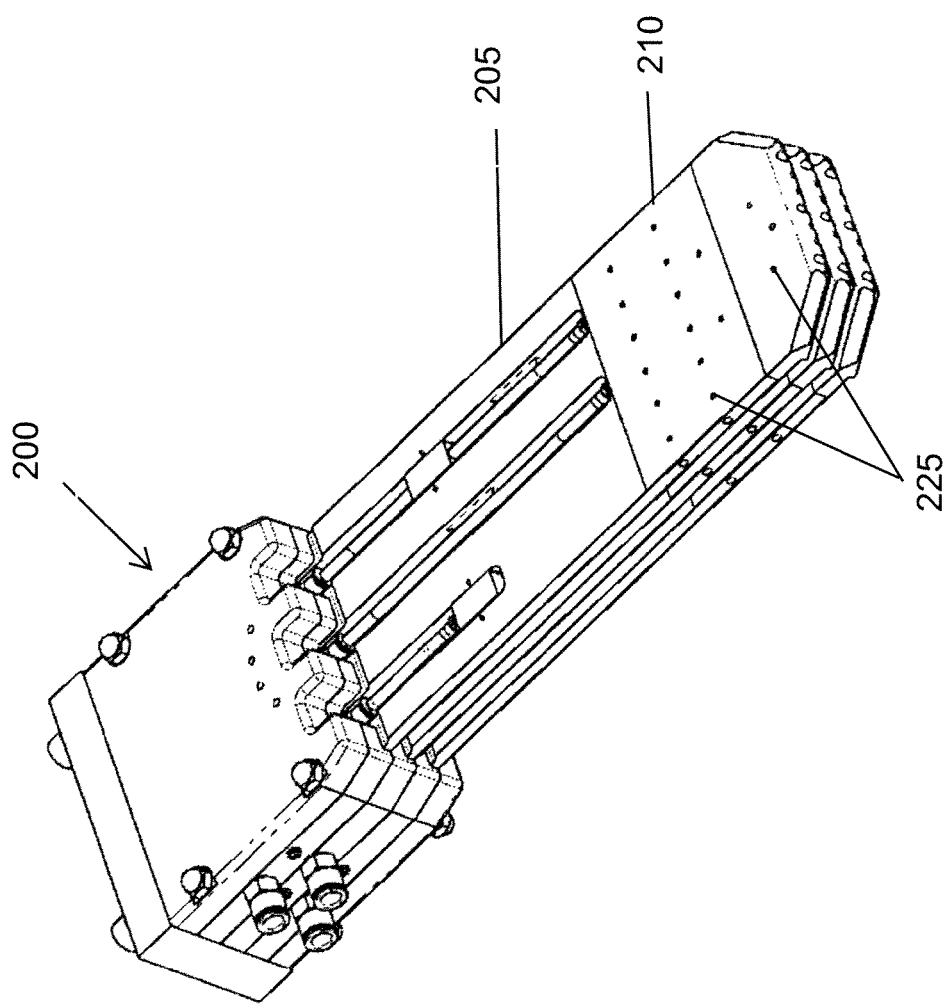
FIGS. 2A and 2B are perspective views of an end effector of a robot for handling wafers.
Figure 2B:
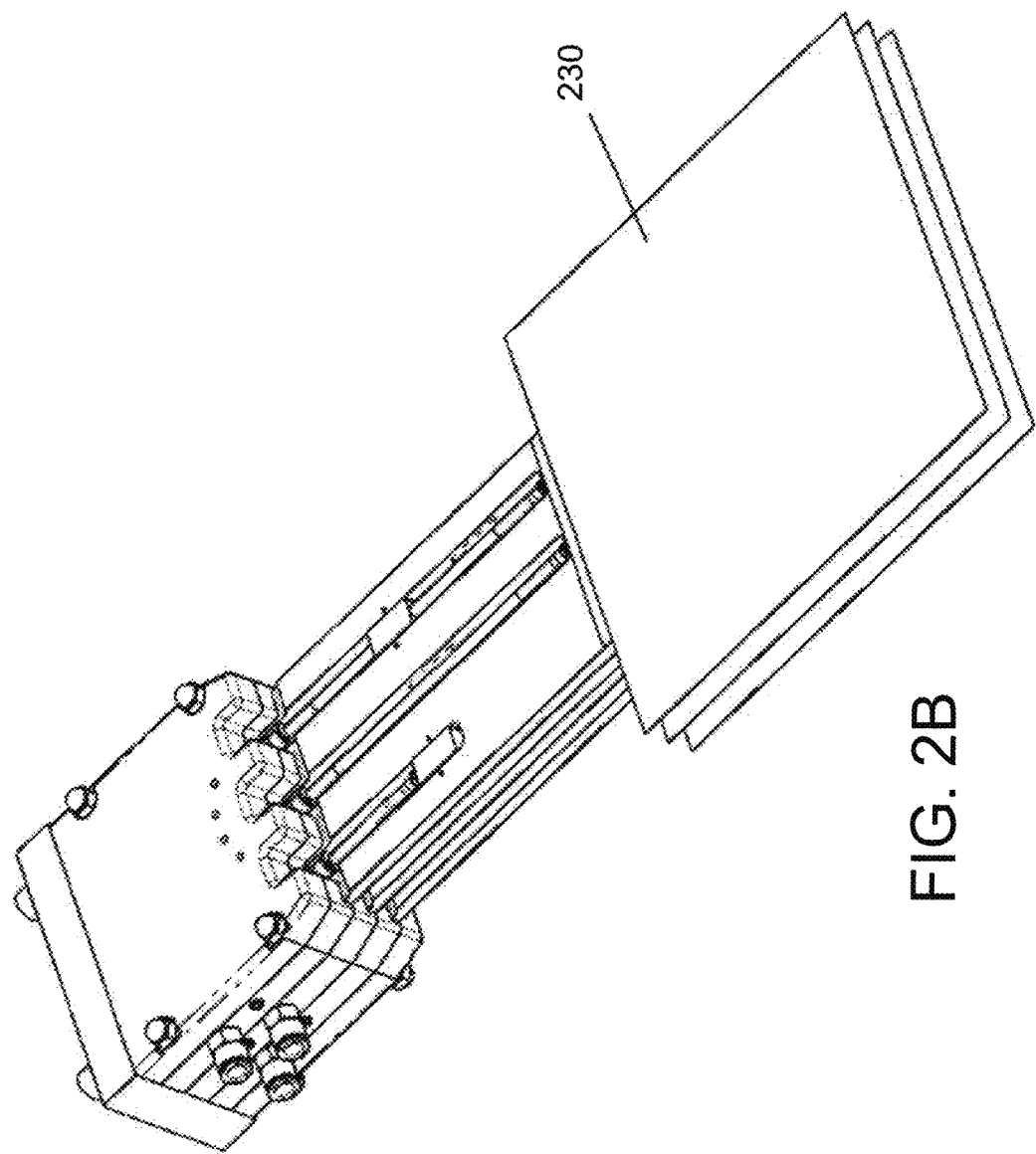
Figure 3B:
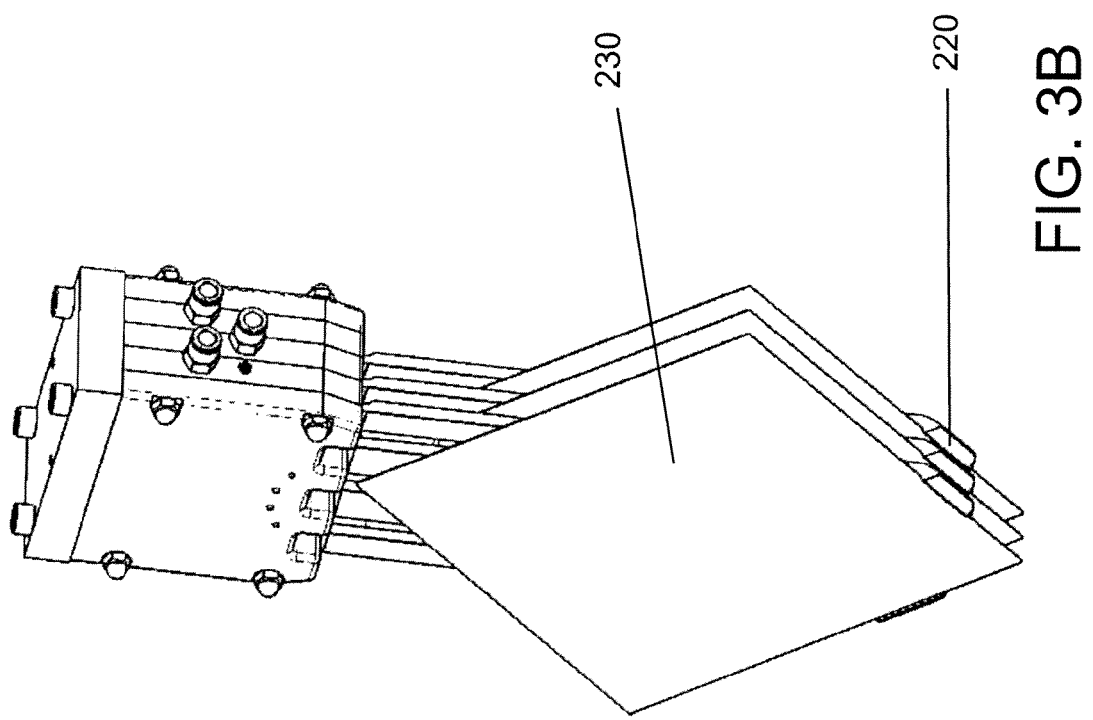

The robot in this embodiment includes a multiaxis arm (not shown) that is equipped with an end effector 200 (sometimes referred to as an end of arm tool (EOAT)). FIGS. 2A, 2B, 3A and 3B show perspective views of the end effector 200 of the robot 105. The end effector includes a plurality of plates 205 (sometimes called fingers). In FIGS. 2 and 3, only three plates are shown but the end effector 200 will typically have as many plates as required to move a predetermined quantity of the wafers from the carrier. One side of the plates is provided with a vacuum gripping system 210 (shown in FIGS. 2A and 2B, sometimes called a vacuum gripper) while the other side is provided with a gravity gripping system 215 (shown in FIGS. 3A and 3B, sometimes called a gravity gripper) comprised of a generally flat surface with mechanical stops 220 at an end thereof that are used to support the wafers when in a BTB arrangement.

As shown in FIGS. 2A and 2B, the vacuum gripper is provided at a distal end of each plate and includes a vacuum supply system and a plurality of pores in communication with the vacuum supply system. The vacuum supply system is configured such that a vacuum hose (not shown) can be attached to the end effector and used to form a vacuum at the plurality of pores to attract the wafers and hold them against the flat plate. FIG. 2B shows the vacuum gripper with wafers 230 gripped.

As shown in FIG. 3A, the gravity gripper 215 includes the flat surface 217 of the plate and two raised portions (mechanical stops 220) provided at a distal end of each plate. The plate can be inserted between wafers and moved such that the flat surface is placed against the wafer and the raised portions are outside the edge of the wafer (e.g. below if the wafer is vertically oriented) such that when the plate is moved, the wafers rest against the flat portion and are supported (e.g vertically if the wafer is positioned vertically, 45 degrees if the wafer is at 45 degrees, horizontally if the wafer is horizontal, etc) by the raised portions, as shown in FIG. 3B. In this embodiment, the raised portions are at an angle in relation to the distal end of the plate and configured to support the wafers in an angled orientation with a corner of the wafer fitting between the raised portions. FIG. 3A illustrates the use of two raised portions but it will be understood that more than two raised portions or mechanical stops could be adapted and used to support the wafers.

It will be understood that other arrangements for the vacuum gripper and the gravity gripper may be available without departing from the scope of embodiments in this application. In this particular embodiment, the vacuum gripper and gravity gripper are opposite sides of the same physical end effector but this is not necessarily the case.

As described briefly above, at the wafer unload station, the carriers filled with wafers are removed from the conveyor system. In this embodiment, the carrier is positioned vertically such that the wafers are arranged horizontally. The carriers typically carry one hundred wafers per carrier with the wafers all oriented such that the process side (sometimes referred to as the "sunny side") is in one direction. In one particular embodiment, the carrier may be positioned such that the wafers are "sunny side down", i.e. the sunny side is facing down.

Although not illustrated, it will be understood that the wafer unload station may include a buffering system to allow for several carriers to be held in place at the wafer unload station, as required. Similarly, the wafer unload station may also include a mechanism for rotating the carrier into an appropriate position if the carrier is in a different position on arrival. Still further, conventional manufacturing information gathering such as RF ID tags, barcodes or the like may be used to track the carrier. For example, an RF ID tag or other identifying information can be read from the carrier at this location. It will be understood that the carriers may also arrive by means other than conveyor, such as manually by an operator, or another transport system or the like.

Figure 4B:
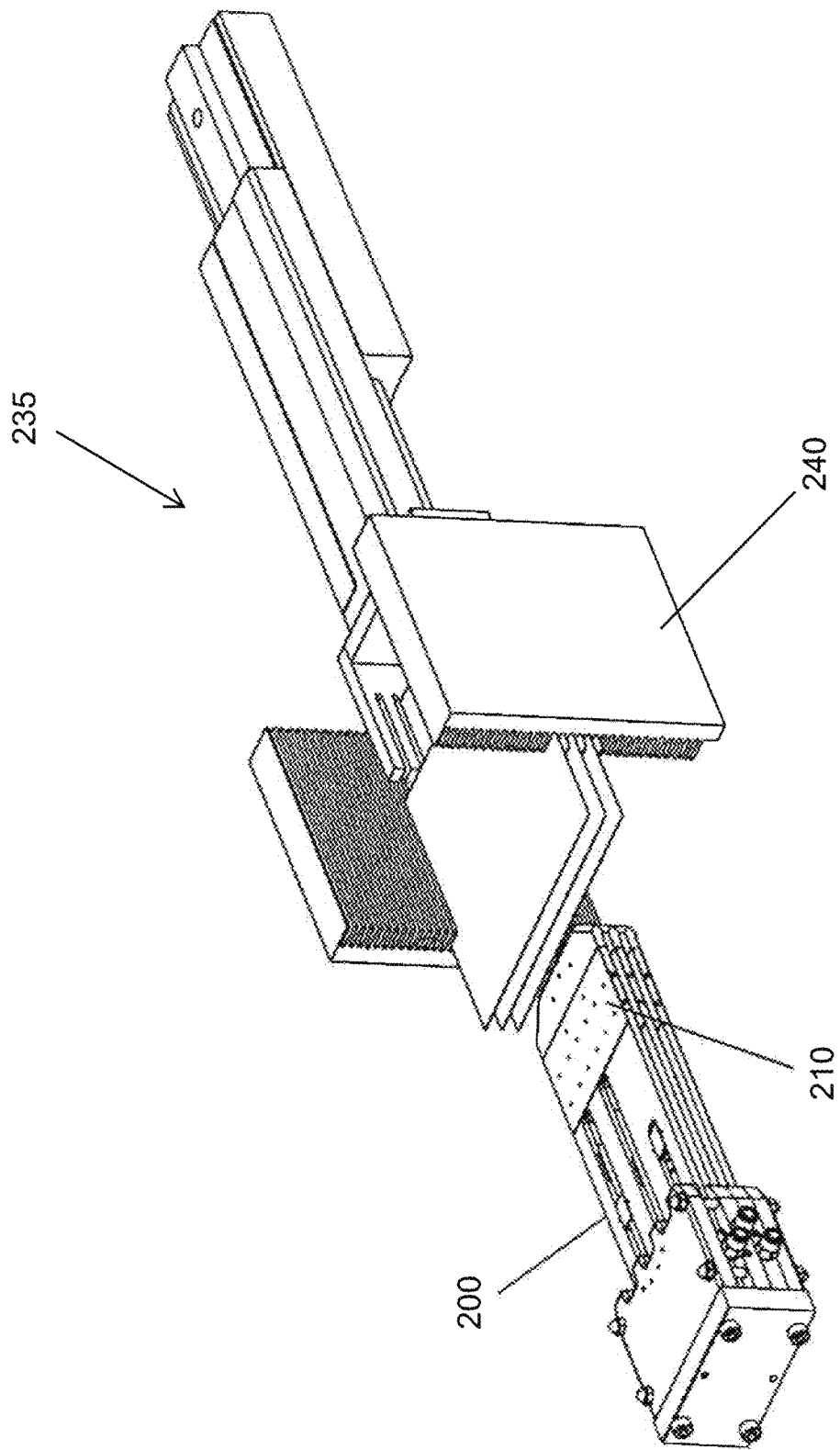

As the wafers are often placed in the carriers with a small distance between each wafer ("pitch"), the wafer unload station may include a pusher unit 235, such as that shown in FIG. 4A, that will push a plurality of wafers forward from the carrier 240 for easier access by the robot, as shown in FIG. 4B. In a particular case, the pusher unit may push every second wafer in the carrier 240 forward for access by the vacuum gripper 210 of the end effector 200 of the robot 105.

In removing the wafers 230 from the carrier 240, as illustrated in FIG. 4C, the robot 105 inserts the plates of the end effector 200 between the wafers 230 that have been pushed forward such that each vacuum gripper 210 engages with an individual wafer. The plates 205 are only inserted far enough to engage the vacuum gripper and do not impact the wafers that are remaining in the carrier. Once the wafers 230 are held by the vacuum gripper 210, the robot 105 slides the wafers out of the carrier and moves them to the intermediate load station.

Figure 5A:
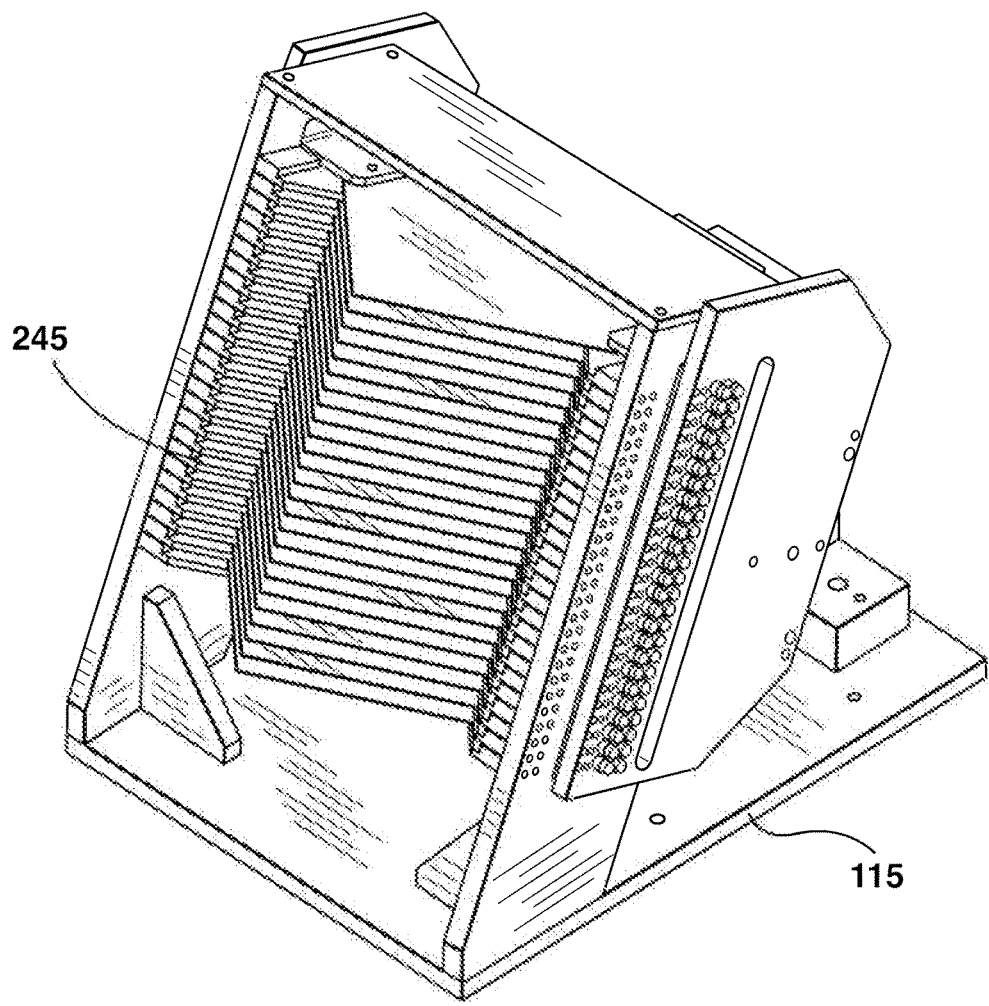
FIGS. 5A and 5B are views of an intermediate load station.
Figure 5B:
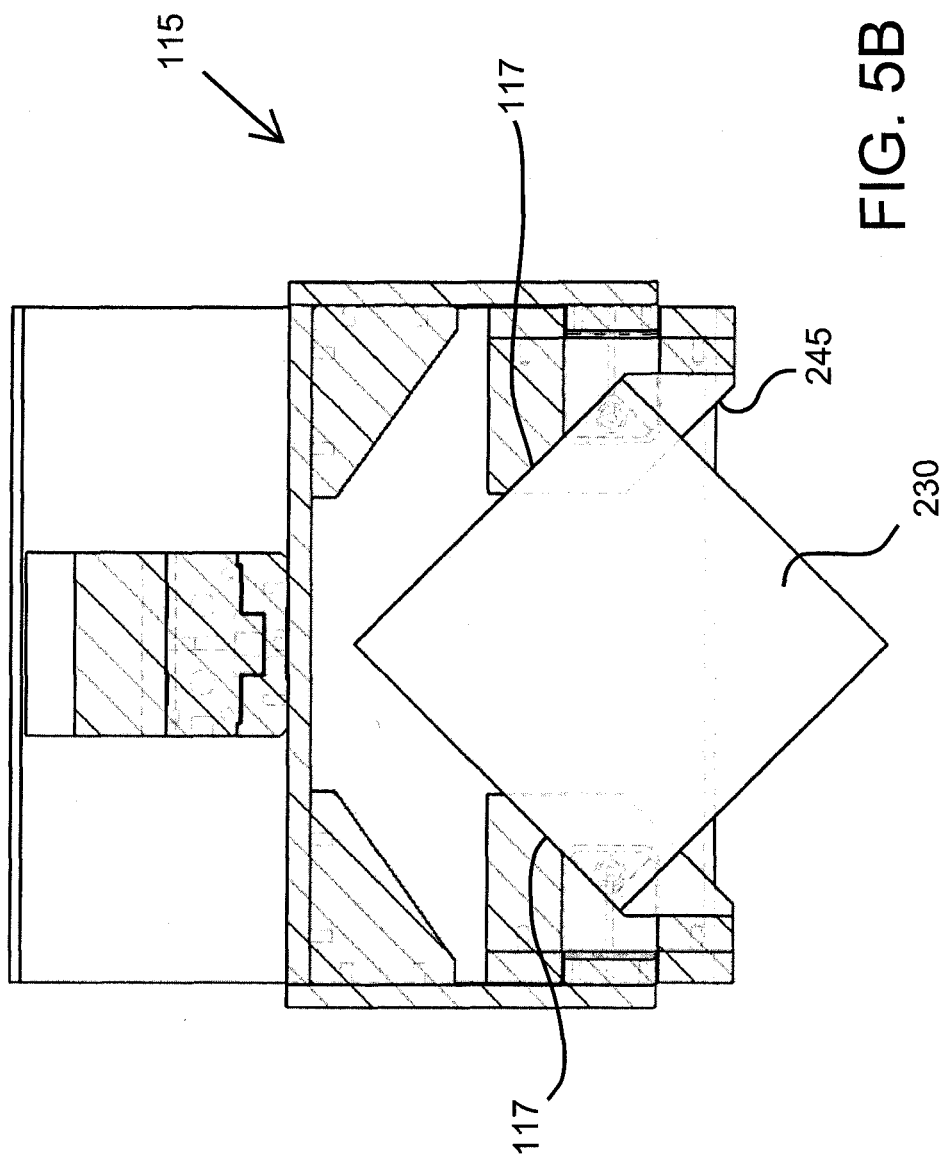

FIG. 5A is a perspective view of the intermediate load station 115 holding a plurality of wafers 230. The intermediate load station includes a plurality of slots 245 for receiving wafers. Each slot is angled such that, as a wafer is inserted, the wafer is aligned by gravity to mechanical stops 117 in the slots. In one particular example, the angle is approximately 45 degrees. In other embodiments, the angle may be between 30 and 60 degrees or some other appropriate angle that will allow the appropriate alignment of the wafers. FIG. 5B is a top sectional view of the intermediate load station showing a wafer in a slot. In this embodiment, each slot is provided with stops 117 each side to support the inserted wafers. In some embodiments, the wafers may be rectangular-shaped and the intermediate station may be further configured to receive a corner of the wafers.

Figure 6A:
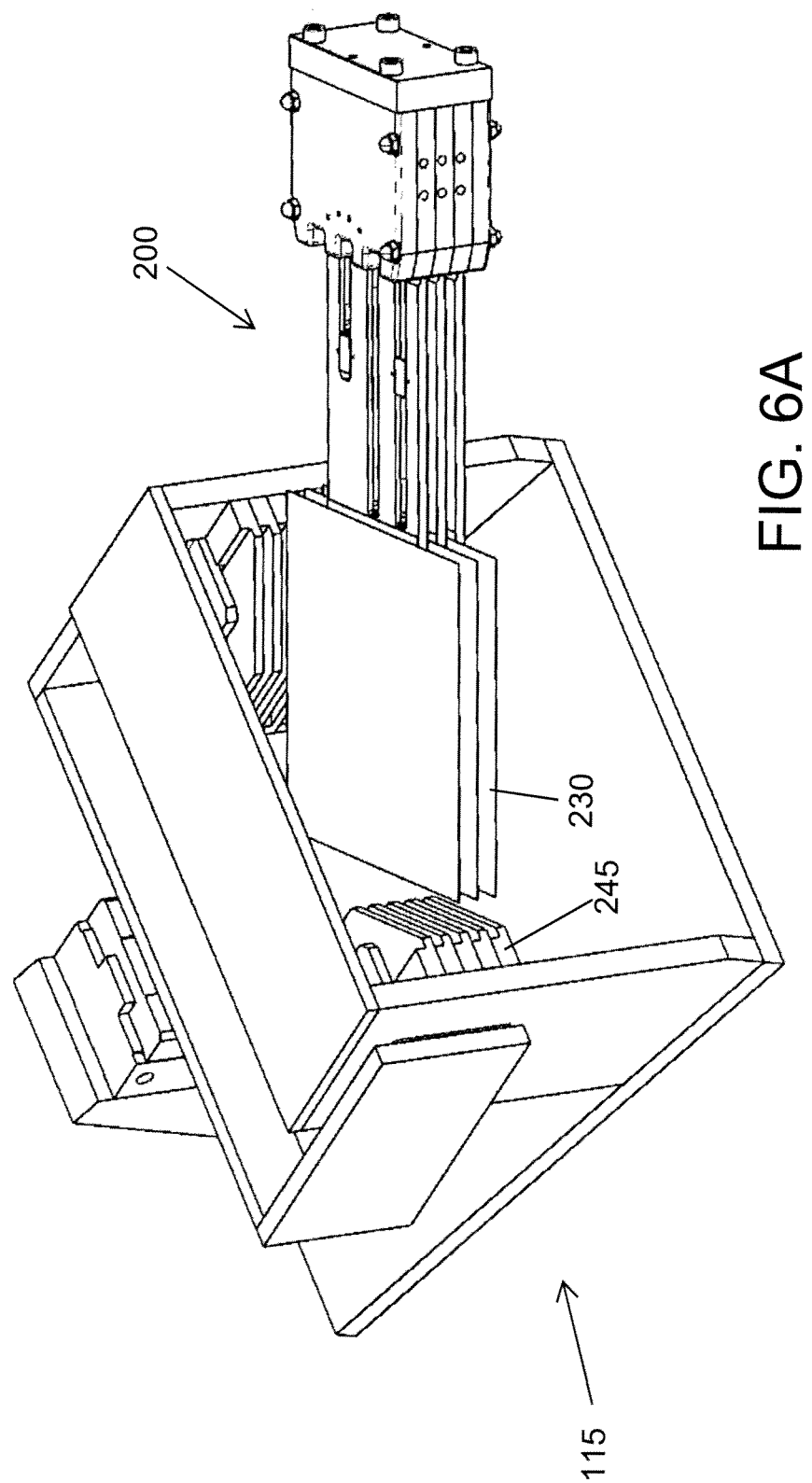
FIGS. 6A and 6B are views of the end effector placing wafers in the intermediate load station.
Figure 6B:
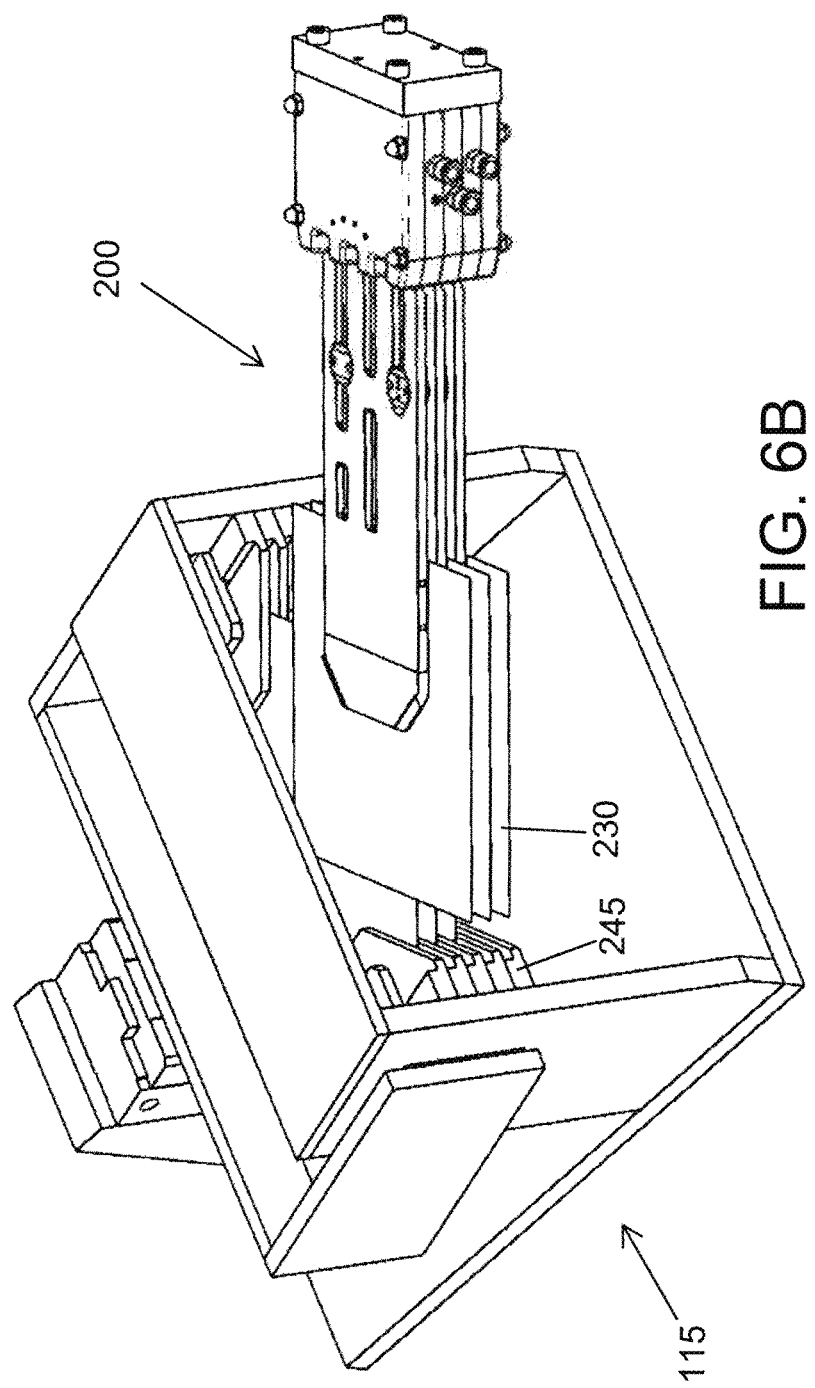

In operation, the robot uses the vacuum gripper to move half of the wafers (the sunny side down wafers) from the carrier to the intermediate load station as shown in FIG. 6A. The robot then returns and grips the remaining wafers with the vacuum gripper, rotates the wafers to a sunny side up position and, as shown in FIG. 6B, places the sunny side up wafers on top of the sunny side down wafers to make the BTB arrangement in the intermediate load station. As shown in FIGS. 6A and 6B, the end effector places the wafers in the intermediate carrier at a forty-five degree rotation to ease entry and exit and allow for better alignment for the BTB arrangement.

The use of an angled intermediate load station is believed to reduce wastage which can be caused by the forces involved in placing wafers directly into a vertical orientation in the furnace boat or the like. Further, as the second wafer of the BTB formation is added to the intermediate station, it can be accurately positioned in relation to the originally placed wafer by gravity acting on the wafer, without the need for complex comb-like structures or the like to attempt to force alignment.

After the unprocessed wafers have been unloaded from the carrier, the carrier can be advanced to the reload station or may be held in a buffer conveyor area while waiting for reload. The RF tags on the carrier may be rewritten with new information to indicate that the carrier is now empty.

Figure 7A:
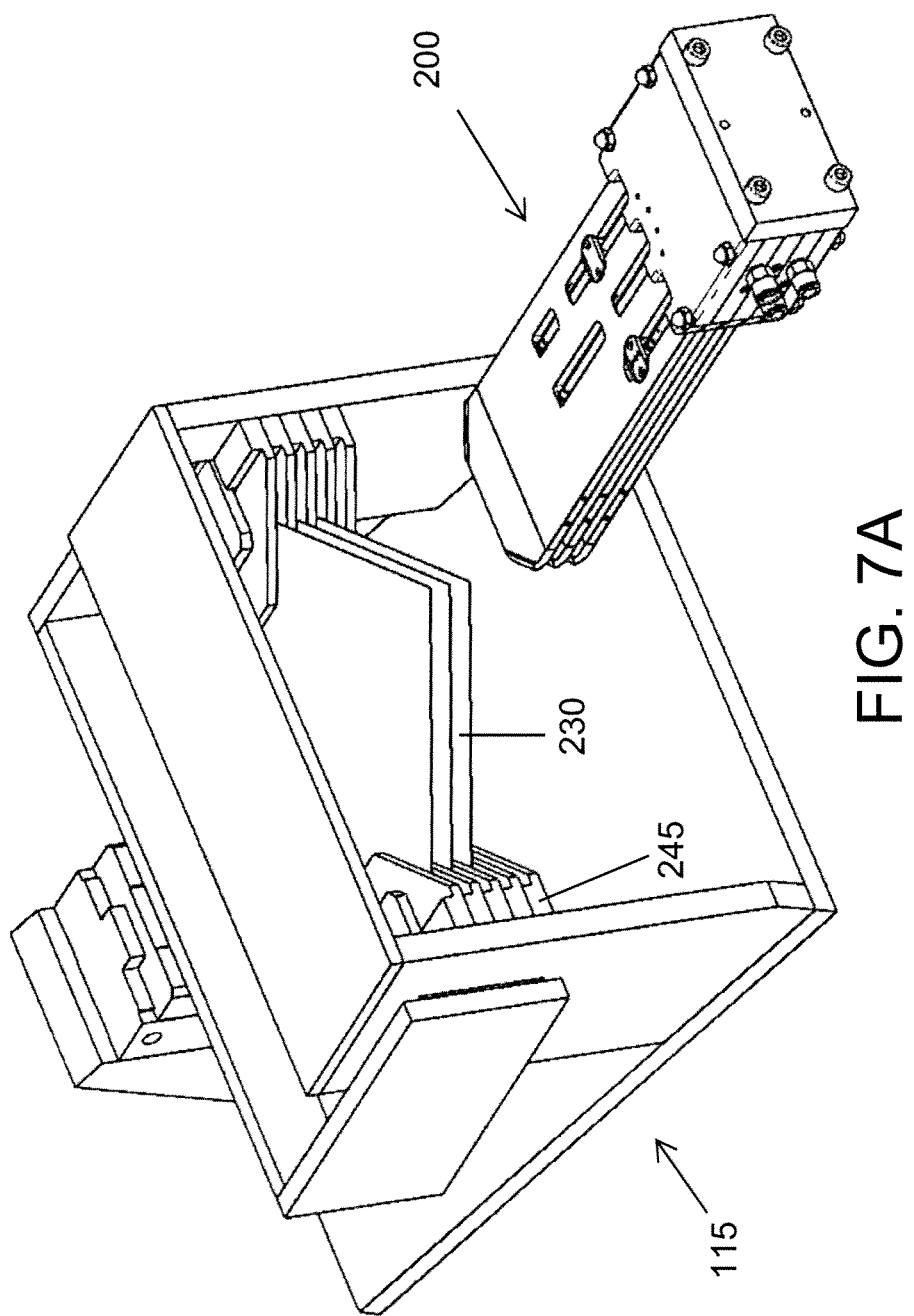

FIG. 7A shows a perspective view of the intermediate load station and the end effector preparing to move the BTB wafers to the boat load station 120. FIG. 7A shows the orientation of the end effector when entering the intermediate load station to pick up the BTB wafers.

As shown in FIG. 7A, when moving the wafers from the intermediate load station, the end effector rotates such that the mechanical stops 220 are oriented upwards and the end effector enters the intermediate load station along a centre line (from corner to corner) of the wafers. The end effector slides between each pair of BTB wafers and, as shown in FIGS. 7B, 7C and 7D, engages such that the BTB wafers are supported by the gravity gripper, that is, supported on the flat surface of the plate and the mechanical stops 220 support a lower edge of the BTB wafers. The mechanical stops and the angled nature of the wafers further assist with alignment of the two BTB wafers.

Figure 8B:
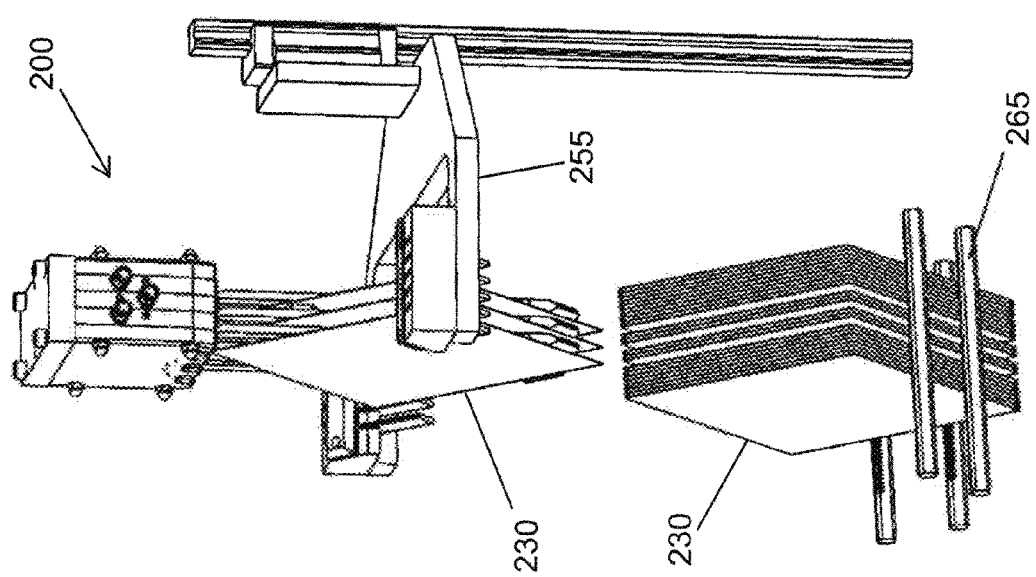

FIGS. 8A and 8B show simplified perspective views of the end effector placing the BTB wafers into a preload edge holding device 255 at the diffusion furnace boat loading station. In FIG. 8A, the BTB wafers are being supported by the gravity gripper 215 (that is, the plates and the mechanical stops on the plates) by having the end effector remain at a slight angle to the vertical. In FIG. 8B the wafers are placed by the end effector in the edge holding device, which has a plurality of slots on each side for supporting the BTB wafers. As shown in FIGS. 8A and 8B, the edge holding device 255 is positioned over the furnace boat and is configured to operate such that it can raise or lower a subset of BTB wafers depending on the needs of the application. For example, the edge holding device may include a mechanical system that engages select slots for supporting select BTB wafers that are to be raised or lowered relative to the furnace boat.

Figure 9B:
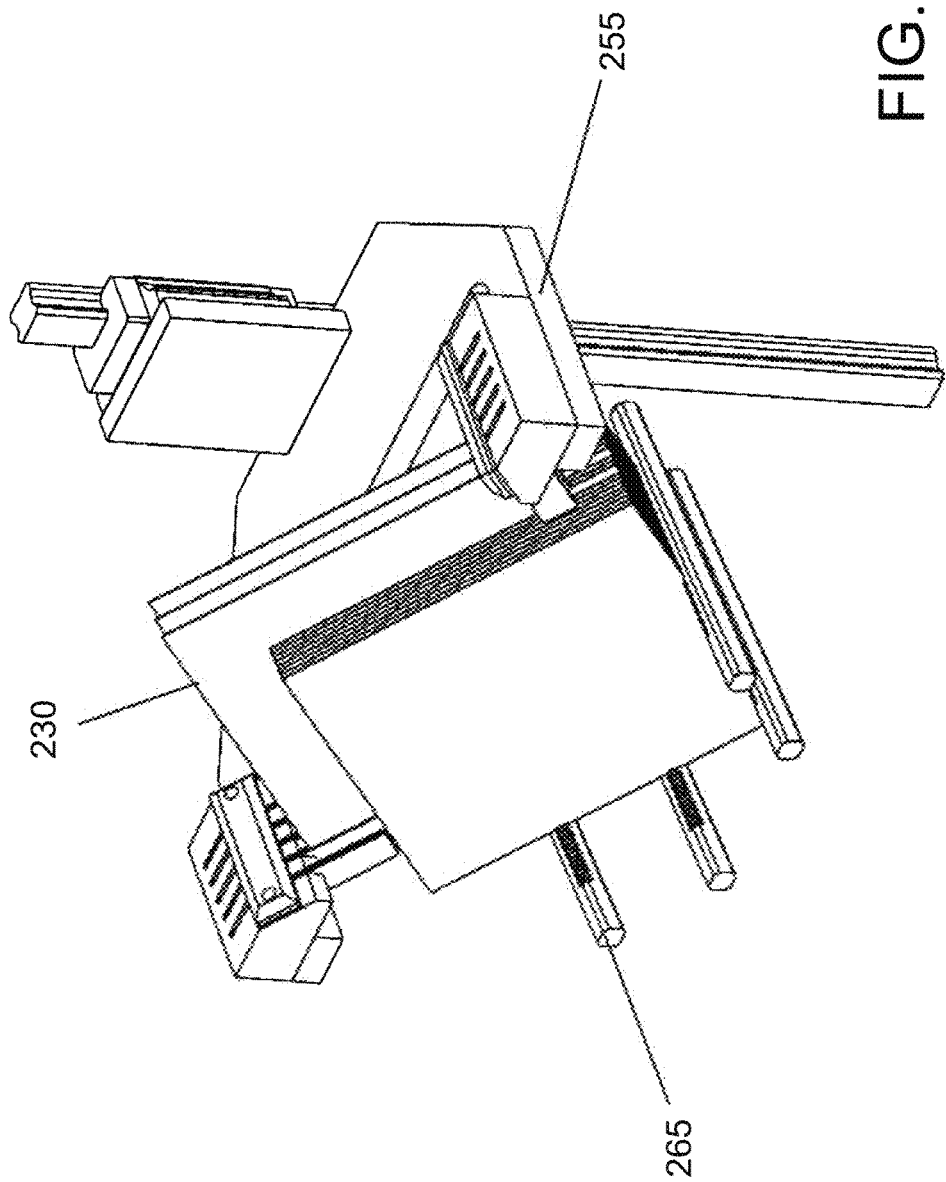
Figure 9C:
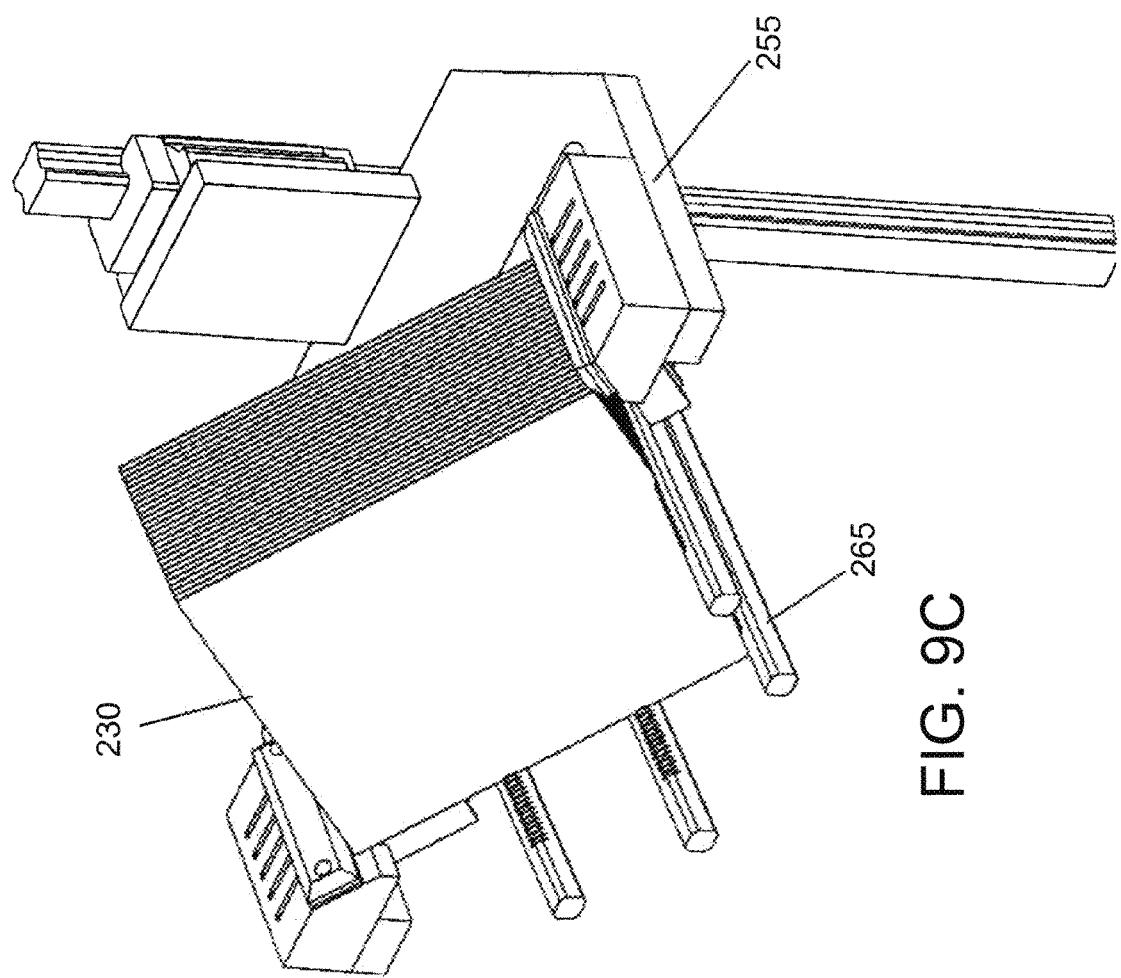
Figure 9D:
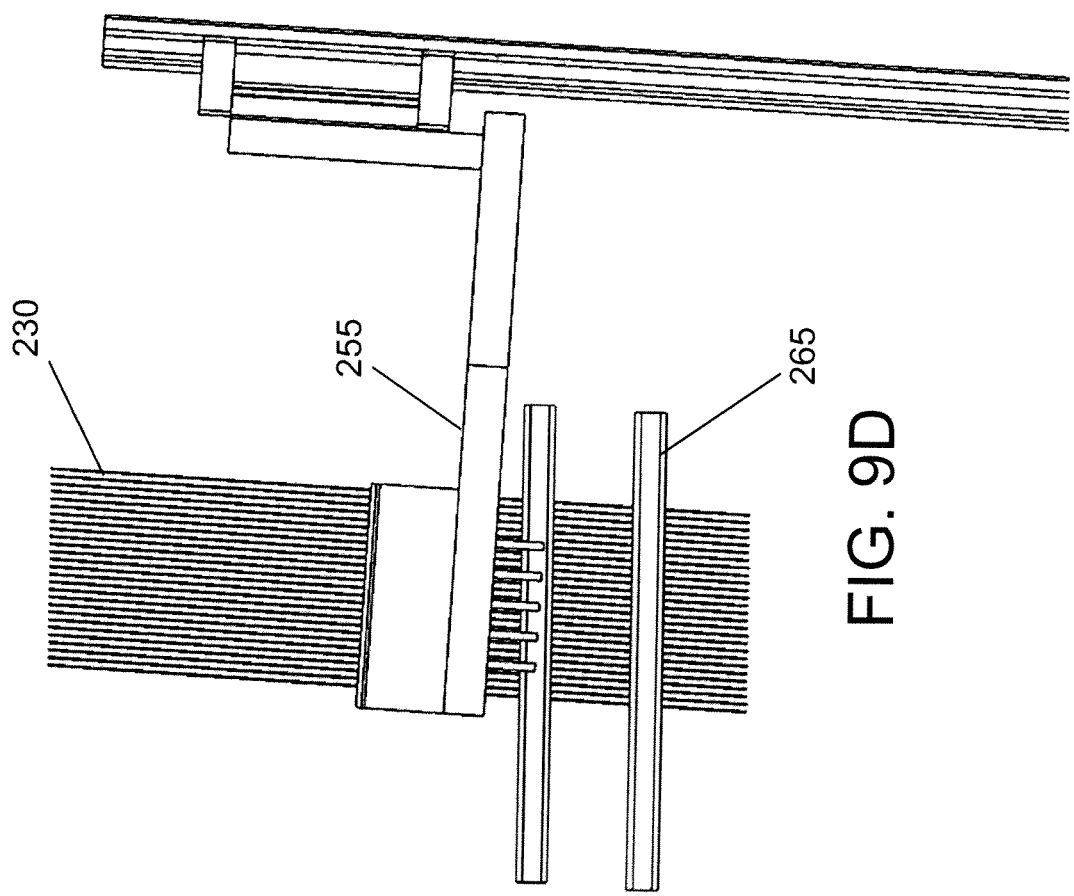
Figure 9E:
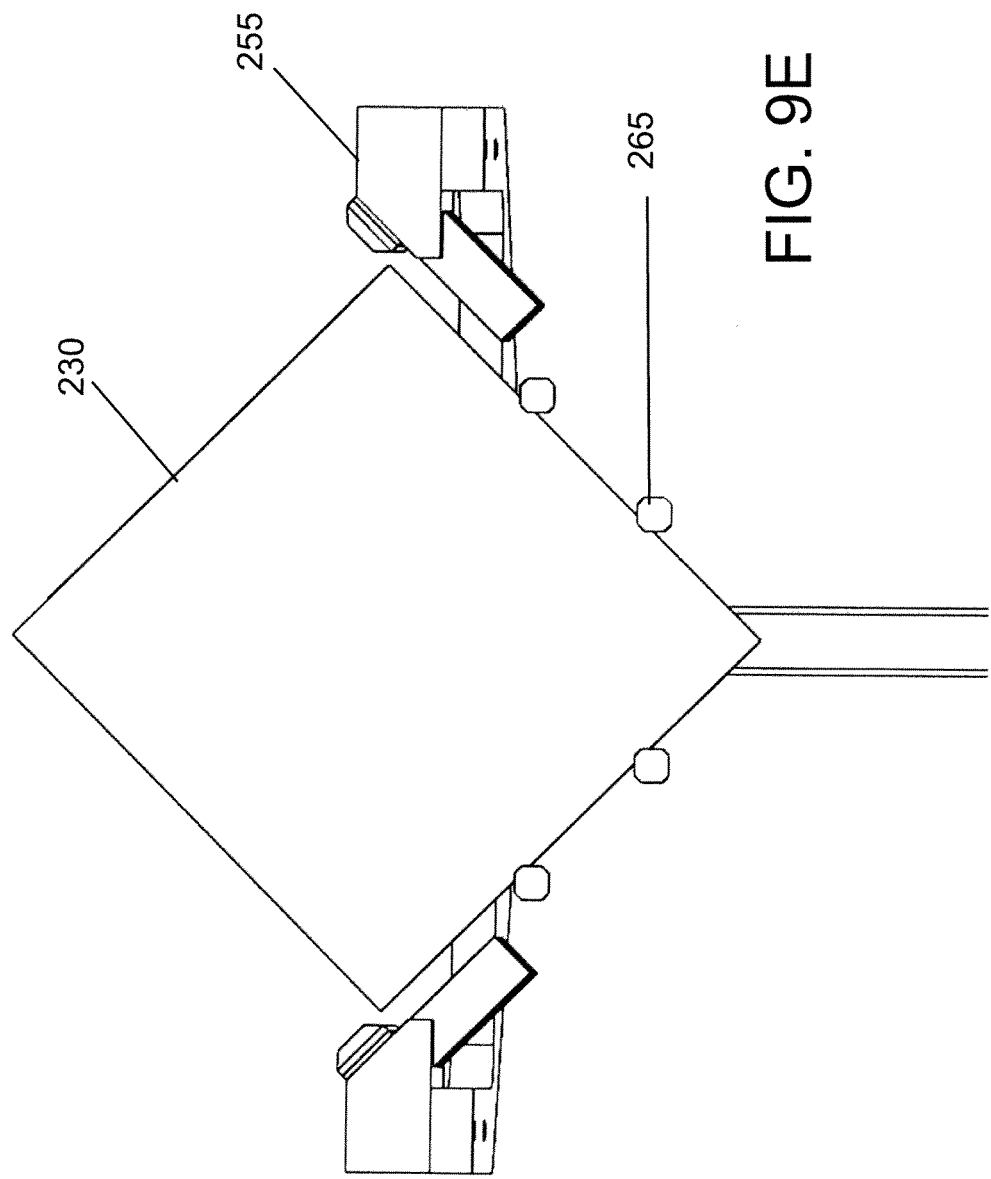

FIGS. 9A to 9E illustrate the boat loading station and procedure for loading the furnace boat. The edge holding device 255 is positioned above the furnace boat and, after receiving the BTB wafers (FIG. 9A), lowers the BTB wafers into the furnace boat 265 (see FIGS. 9B to 9D). As shown in FIG. 9E, the edge holding device can continue to lower and release the BTB wafers at the furnace boat. The use of the edge holding device, which is accurately positioned relative to the furnace boat, allows for accurate positioning of the BTB wafers in the boat with less risk of breakage or the like than might be the case if an end effector were to be used to place the wafers in the furnace boat directly.

Figure 10D:
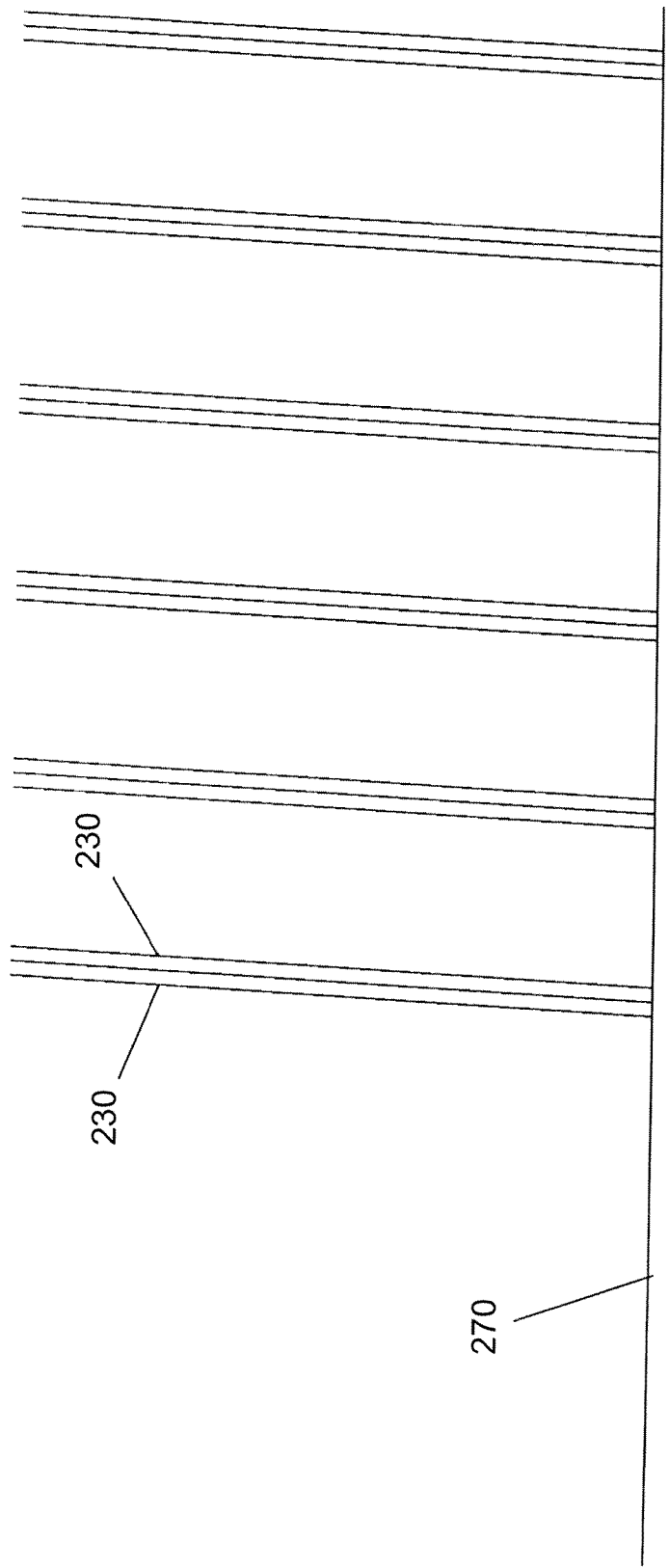

As shown in FIGS. 10A to 10D, the BTB wafers are supported on rails 270 in the furnace boat 265. Each rail 270 is provided with simple slots to accommodate a set of BTB wafers. FIG. 10D illustrates that the sets of BTB wafers are slightly angled to assist with maintaining alignment.

Following loading, the furnace boat is transferred to a diffusion furnace, where the wafers are treated.

Following the treatment, the furnace boat moves to the boat unloading station where the edge holding device generally executes a reverse operation to that shown in FIGS. 9A to 9E. In particular, the edge holding device 255 raises from below the furnace boat, engages with the treated BTB wafers 230 and raises the BTB wafers out of the furnace boat. The end effector of the robot then engages the treated BTB wafers using the gravity gripper (flat plate and mechanical stops), lifting the BTB wafers out of the edge holding device in a manner similar to FIGS. 8A and 8B, and moving them to the intermediate unload station, in a manner similar to FIGS. 7A to 7D.

Figure 11A:
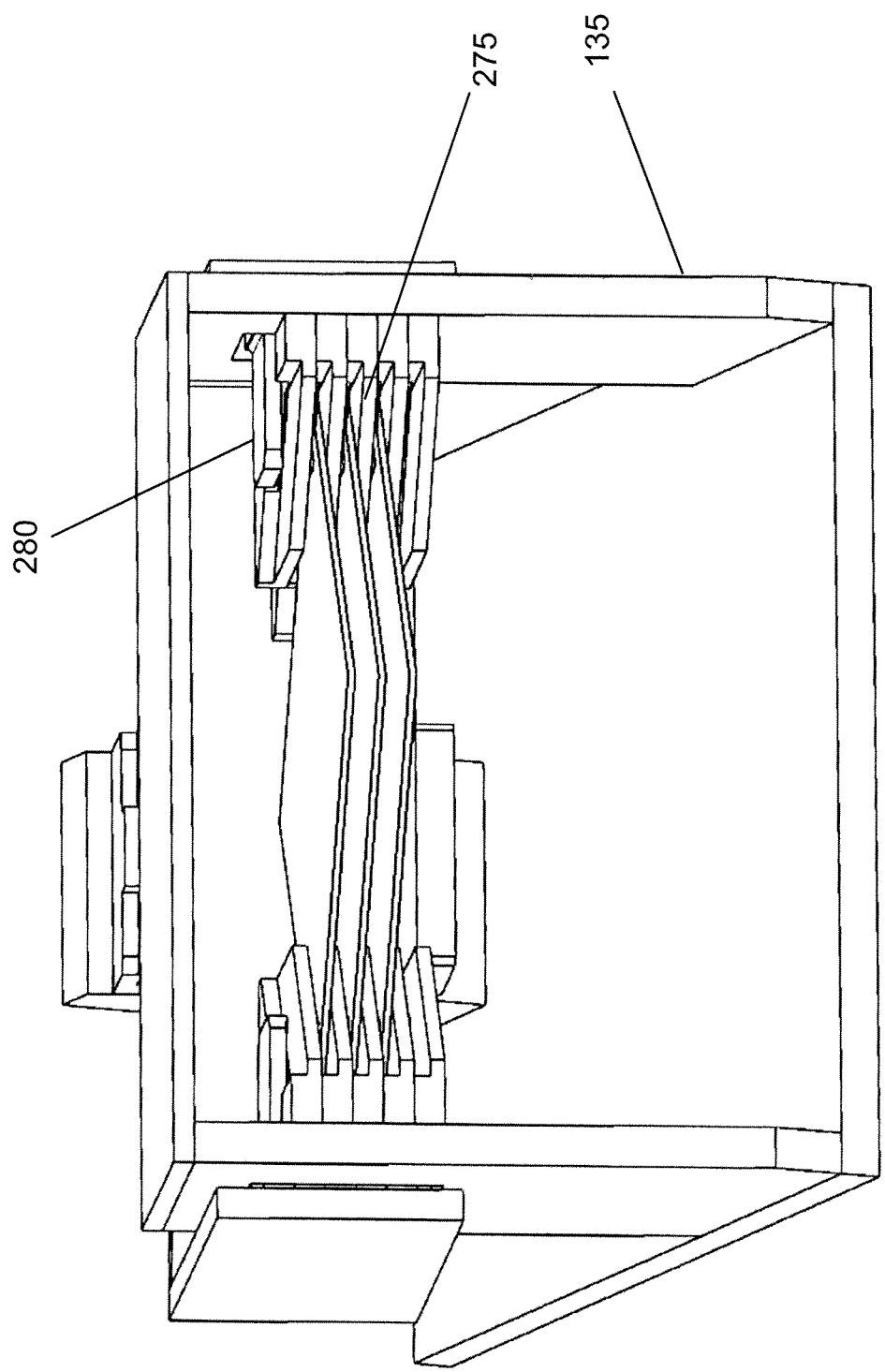
FIGS. 11A, 11B, 11C, and 11D are views of an intermediate unload station and an end effector removing wafers from the intermediate unload station.
Figure 11B:
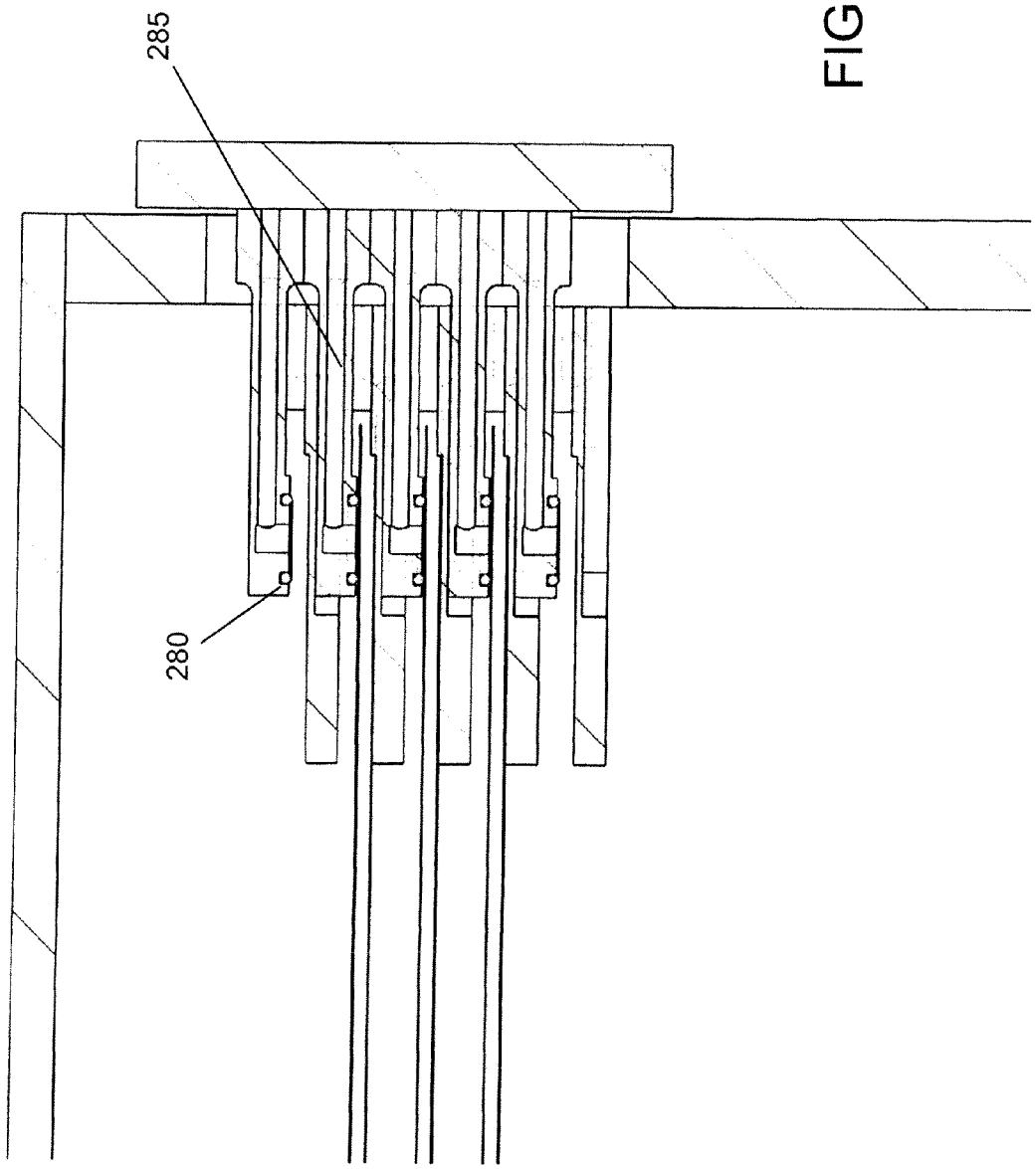

The intermediate unload station is shown in FIG. 11A and is similar to the intermediate load station but includes a wafer separation mechanism that is used to separate the BTB wafers. FIG. 11B shows the slots 275 in the intermediate unload station in more detail. Each slot includes a slot plate for supporting the BTB wafers when first placed in the intermediate unload station. Each slot also includes a vacuum element 280 that is configured to lift the upper wafer of the BTB wafers away from the lower wafer so that the wafers can be separated. In this embodiment, the vacuum element 280 is provided on an arm 285 that extends over the upper wafer and that is movable to come into contact with the upper wafer such that a vacuum opening can provide suction and lift the upper wafer as shown in FIG. 11B.

Figure 11C:
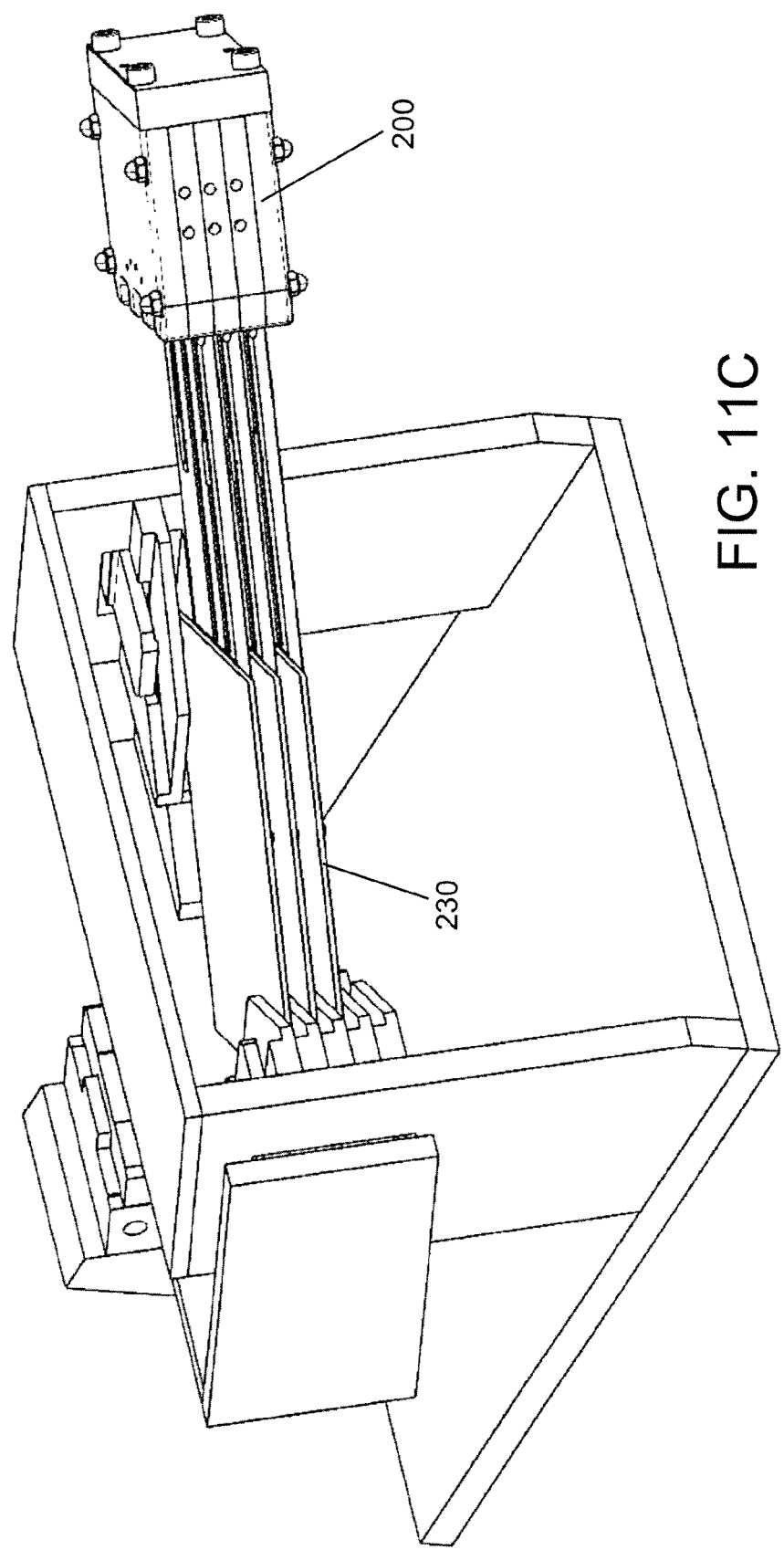
Figure 11D:
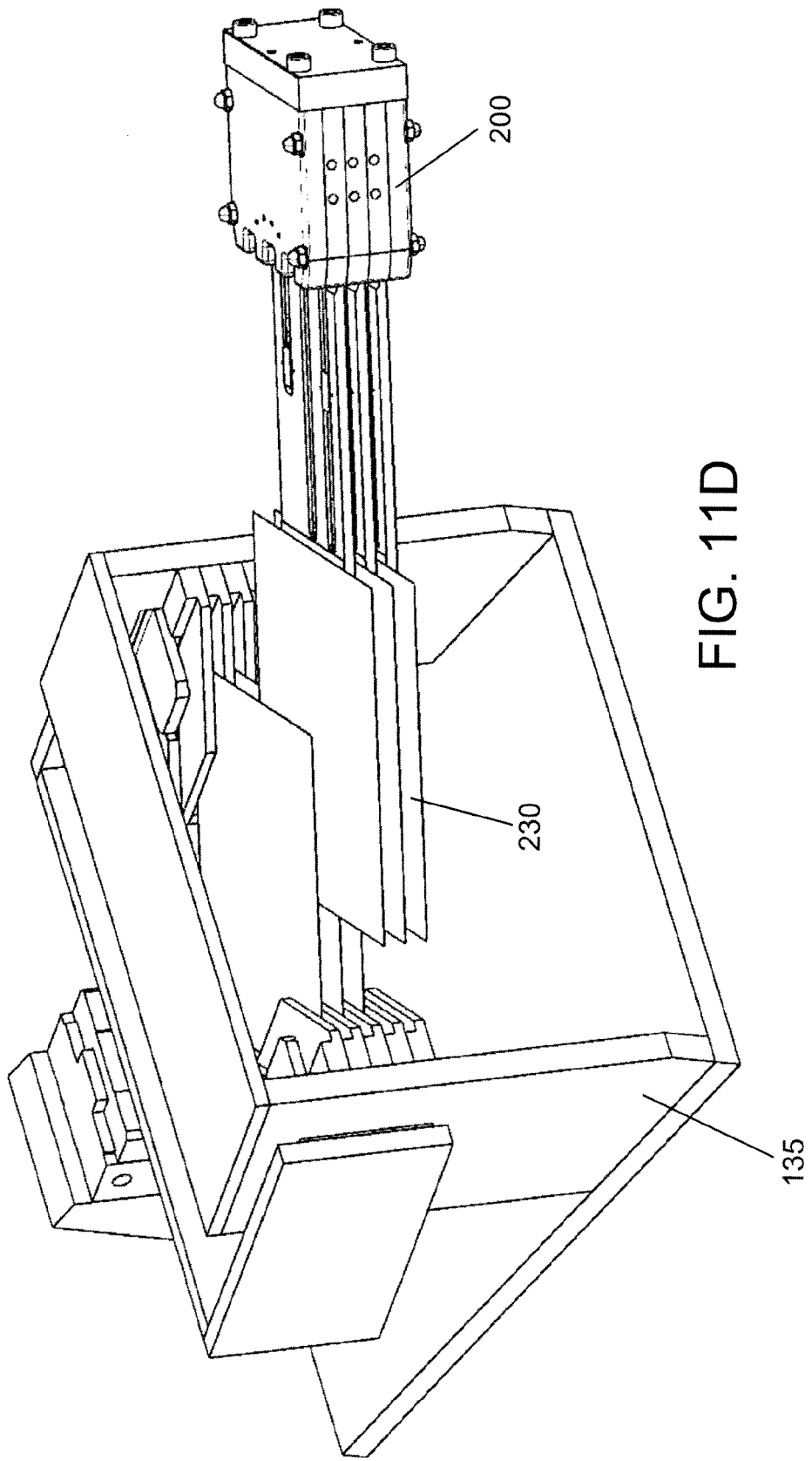

Once the wafers have been separated, the end effector then rotates such that the vacuum gripper is inserted adjacent the lower wafers. The end effector 200 uses the vacuum gripper 210 to engage the lower wafers (a first group of wafers) as shown in FIGS. 11C and 11D and move the gripped wafers 230 to the carrier, which is at the reload station. In this particular embodiment, the carrier may be positioned horizontally so that the wafers can be inserted vertically. The vacuum gripper is then used to engage the remaining wafers and rotate them for insertion in the carrier such that all wafers are in the same orientation, for example, "sunny side" up.

The carrier can then be moved from the reload station onto a conveyor or the like to be moved for further processing.

Figure 12:
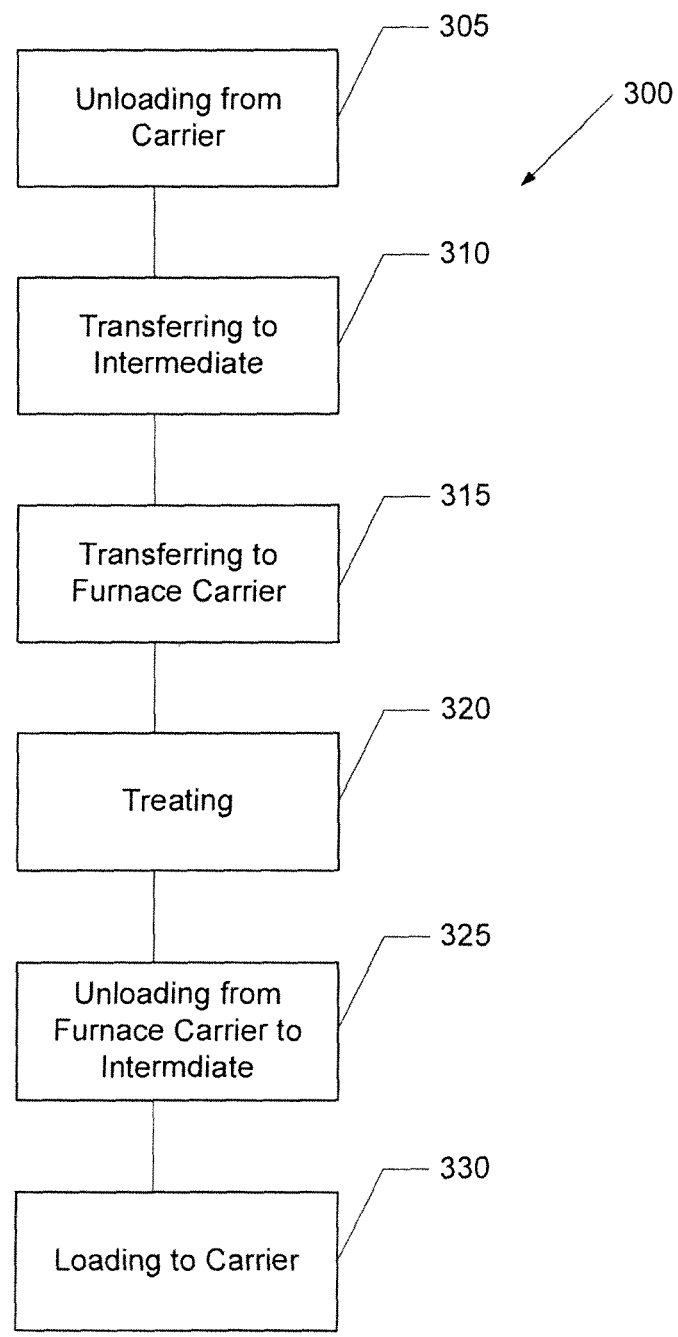
FIG. 12 is a flow chart of an exemplary method for handling wafers.

FIG. 12 shows a flow chart of an example method for wafer handling 300 according to an embodiment herein. In this particular embodiment, the wafers are first unloaded 305 from a carrier at an unload station. The carrier may arrive at the unload station by way of conveyor system or by another transportation system. The transfer device or robot may unload the wafers as described above. Once unloaded from the carrier the wafers are removed and transferred to an intermediate station 310, where they may be placed in a back-to-back arrangement. This back-to-back arrangement is described in detail above.

The wafers are further transferred to a processing station 315 from the intermediate station by a transfer device. At the processing station the BTB wafers may be loaded into a furnace boat or other carrier that is designed to be moved into a diffusion furnace. An edge holding device may complete the loading of the furnace boat. The diffusion furnace then treats the wafers 320.

Once treated 320 the wafers may then be unloaded from the furnace boat of the processing station 325 to a second intermediate station. It will be understood that this second intermediate station may actually be the same intermediate station if there is lower throughput and only one intermediate station is required. If there is higher throughput multiple intermediation stations and transfer devices may be used.

The BTB wafers may now be separated into single wafers and reloaded into the carrier (330) or a separate carrier.

It will be understood that other arrangements and embodiments will be apparent to those skilled in the art based on the disclosure of the above embodiments. For example, the robot described herein is a multiaxis robot but could be replaced by a plurality of robots having fewer axes.

It will also be understood that although solar wafers are described, the method, system and apparatus would handle other wafers and should not be considered limited to wither solar cell wafers or silicon wafers.

It should be understood that various modifications can be made to the exemplary embodiments described and illustrated herein, without departing from the general scope of the appended claims. In particular, it should be understood that while the embodiments have been described for solar cell wafers, the embodiments are generally applicable to wafer handling.

Although this disclosure has described and illustrated certain embodiments of the invention, it is also to be understood that the system, apparatus and method described is not restricted to these particular embodiments. Rather, it is understood that all embodiments which are functional or mechanical equivalents of the specific embodiments and features that have been described and illustrated herein are included.

It will be understood that, although various features have been described with respect to one or another of the embodiments of the invention, the various features and embodiments may be combined or used in conjunction with other features and embodiments as described and illustrated herein.

What is claimed is:

1. A system for handling a plurality of wafers, the wafers having a generally planar upper surface and a generally planar lower surface, the system comprising:
    at least one load/unload station;
    at least one intermediate station having a front loading end and a back stop end, the at least one intermediate station configured to hold the wafers with a plane of the wafers positioned at an angle to a horizontal plane and wherein the angle is between 30 and 60 degrees downwardly from the front loading end to the back stop end,
    wherein the at least one intermediate station has at least one slot configured to receive a first one of the plurality of wafers and a second one of the plurality of wafers in a back-to-back arrangement wherein the first wafer is inserted into the at least one slot, and the second wafer is inserted into the at least one slot adjacent to the first wafer with the adjacent surfaces of the first and second wafers in contact, the at least one intermediate station further comprising a wafer separation mechanism configured to separate the first and second wafers from the back-to-back arrangement, wherein the wafer separation mechanism comprises a vacuum element configured to lift the second wafer in the back-to-back arrangement; and
    a transfer device configured to transport the wafers between the load/unload station and the intermediate station.

2. The system according to claim 1, wherein the transfer device is provided with a vacuum gripper and a gravity gripper.

3. The system according to claim 1, wherein the at least one intermediate station comprises a plurality of slots, each slot provided with a rear stop at the back stop end configured to support a wafer.

4. The system according to claim 1, wherein the angle is 45 degrees.

5. The system according to claim 1, wherein the second wafer is inserted into the at least one slot of the at least one intermediate station on top of the first wafer with the respective upper surfaces of the first and second wafers in contact to form the back-to-back arrangement.

6. The system according to claim 1, wherein the transfer device is configured to remove wafers in the back-to-back arrangement from the at least one intermediate station and place the wafers into an edge holding device for loading into a processing carrier.

7. The system according to claim 1, wherein the second wafer is inserted into the at least one slot of the at least one intermediate station on top of the first wafer with the respective lower surfaces of the first and second wafers in contact to form the back-to-back arrangement.

8. The system according to claim 1, wherein the system further comprises a processing station, the processing station is configured to accept a processing carrier loaded with the plurality of wafers, wherein the processing carrier is moved to the processing station for processing.

9. A system for handling a plurality of wafers, the wafers having a generally planar upper surface and a generally planar lower surface, the system comprising:
    at least one intermediate station comprising a front loading end and a back stop end, the at least one intermediate station configured to hold the wafers with a plane of the wafers positioned at an angle to a horizontal plane, wherein the at least one intermediate station comprises at least one slot configured to receive a first one of the plurality of wafers as a lower wafer and a second one of the plurality of wafers as an upper wafer in a back-to-back arrangement, the at least one intermediate station further comprising a wafer separation mechanism configured to separate the lower and upper wafers from the back-to-back arrangement, wherein the wafer separation mechanism comprises a vacuum element configured to lift the upper wafer from the back-to-back arrangement; and
    a transfer device configured to transport the wafers to and from the intermediate station.

10. The system of claim 9, wherein the vacuum element is in the at least one slot.

11. The system of claim 10, wherein the transfer device is configured to be inserted into the intermediate station between the upper and lower wafers and grip one of the upper and lower wafers for removal from the intermediate station.

12. The system of claim 11, wherein the one of the upper and lower wafers gripped is the lower wafer.

13. The system of claim 9, wherein the at least one intermediate station comprises a plurality of slots, each slot provided with a rear stop at the back stop end configured to support a wafer.

14. The system of claim 9, wherein the angle is between 30 and 60 degrees downwardly from the front loading end to the back stop end.

15. The system of claim 14, wherein the angle is 45 degrees.

* * * * *